(12) United States Patent
Ikeda

(10) Patent No.: US 10,342,170 B2
(45) Date of Patent: Jul. 2, 2019

(54) ELECTRONIC COMPONENT SUPPLY APPARATUS, REEL APPARATUS, TAPE PROCESSING APPARATUS, AND METHOD FOR RESUPPLYING COMPONENT STORED TAPE

(71) Applicant: YAMAHA HATSUDOKI KABUSHIKI KAISHA, Iwata-shi, Shizuoka-ken (JP)

(72) Inventor: Hiroshi Ikeda, Tokyo (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 0 days.

(21) Appl. No.: 15/538,246

(22) PCT Filed: Oct. 5, 2015

(86) PCT No.: PCT/JP2015/078248
§ 371 (c)(1),
(2) Date: Jun. 21, 2017

(87) PCT Pub. No.: WO2016/103840
PCT Pub. Date: Jun. 30, 2016

(65) Prior Publication Data
US 2017/0354071 A1 Dec. 7, 2017

(30) Foreign Application Priority Data

Dec. 25, 2014 (JP) .................................. 2014-262524

(51) Int. Cl.
*B65H 37/00* (2006.01)
*B32B 43/00* (2006.01)
(Continued)

(52) U.S. Cl.
CPC ........... *H05K 13/021* (2013.01); *B65H 75/32* (2013.01); *B65H 75/4486* (2013.01);
(Continued)

(58) Field of Classification Search
CPC ............. H05K 13/021; H05K 13/0408; H05K 13/0417; H05K 13/0419
See application file for complete search history.

(56) References Cited

U.S. PATENT DOCUMENTS 4,887,778 A * 12/1989 Soth .................... H05K 13/0417
226/109
6,162,007 A * 12/2000 Witte ..................... B65H 20/22
221/211

(Continued)

FOREIGN PATENT DOCUMENTS

| CN | 102811599 A | 12/2012 |
|---|---|---|
| JP | H04-039997 A | 2/1992 |

(Continued)

OTHER PUBLICATIONS

International Search Report issued in PCT/JP2015/078248; dated Jan. 12, 2016.

(Continued)

*Primary Examiner* — Mark A Osele
(74) *Attorney, Agent, or Firm* — Studebaker & Brackett PC

(57) ABSTRACT

An electronic component supply apparatus (1) includes a reel apparatus (2) and a tape processing apparatus (3). The reel apparatus (2) has a tape reel (8) with a component stored tape (100) wound thereon, the component stored tape (100) having electronic components (105) stored therein. The tape processing apparatus (3) has an electronic component exposure unit (18) that exposes the electronic components (105), that are stored in the component stored tape fed from the reel (Continued)

apparatus (2), so as to be taken out from the component stored tape. The reel apparatus (2) is detachable from the tape processing apparatus (3).

5 Claims, 29 Drawing Sheets

(51) Int. Cl.
*H05K 13/02* (2006.01)
*H05K 13/04* (2006.01)
*B65H 75/32* (2006.01)
*B65H 75/44* (2006.01)
*H05K 13/08* (2006.01)

(52) U.S. Cl.
CPC ..... *H05K 13/0417* (2013.01); *H05K 13/0419* (2018.08); *H05K 13/086* (2018.08); *B65H 2701/37* (2013.01)

(56) References Cited

U.S. PATENT DOCUMENTS

| | | | | |
|---|---|---|---|---|
| 6,773,542 | B2 * | 8/2004 | Bergstrom | H05K 13/0417 156/701 |
| 7,380,581 | B2 * | 6/2008 | Ricketson | H05K 13/0419 156/750 |
| 7,866,518 | B2 * | 1/2011 | Wada | H05K 13/0417 226/128 |
| 8,678,065 | B2 * | 3/2014 | Hwang | H05K 13/0215 156/764 |
| 2010/0186901 | A1 | 7/2010 | Ikeda et al. | |
| 2011/0243695 | A1 | 10/2011 | Hwang et al. | |
| 2012/0285628 | A1 | 11/2012 | Katsumi et al. | |
| 2016/0205819 | A1 * | 7/2016 | Jacobsson | H05K 13/021 700/112 |

FOREIGN PATENT DOCUMENTS

| | | |
|---|---|---|
| JP | H04-076997 A | 3/1992 |
| JP | H11-121984 A | 4/1999 |
| JP | 2004-071760 A | 3/2004 |
| JP | 2006-253211 A | 9/2006 |
| JP | 2010-199567 A | 9/2010 |
| JP | 2011-138834 A | 7/2011 |
| JP | 2011-211169 A | 10/2011 |
| JP | 2012-038762 A | 2/2012 |
| JP | 2012-248784 A | 12/2012 |
| JP | 2013-004574 A | 1/2013 |
| JP | 2013-225716 A | 10/2013 |

OTHER PUBLICATIONS

An Office Action mailed by the State Intellectual Property Office of the People's Republic of China dated Mar. 4, 2019, which corresponds to Chinese Patent Application No. 201580071003.7 and is related to U.S. Appl. No. 15/538,246; with English translation.

An Office Action mailed by the Japanese Patent Office dated Aug. 7, 2018, which corresponds to Japanese Patent Application No. 2014-262524 and is related to U.S. Appl. No. 15/538,246.

An Office Action mailed by the Korean Patent Office dated Nov. 13, 2018, which corresponds to Korean Patent Application No. 10-2017-7018829 and is related to U.S. Appl. No. 15/538,246; with English translation.

* cited by examiner

FIG.4
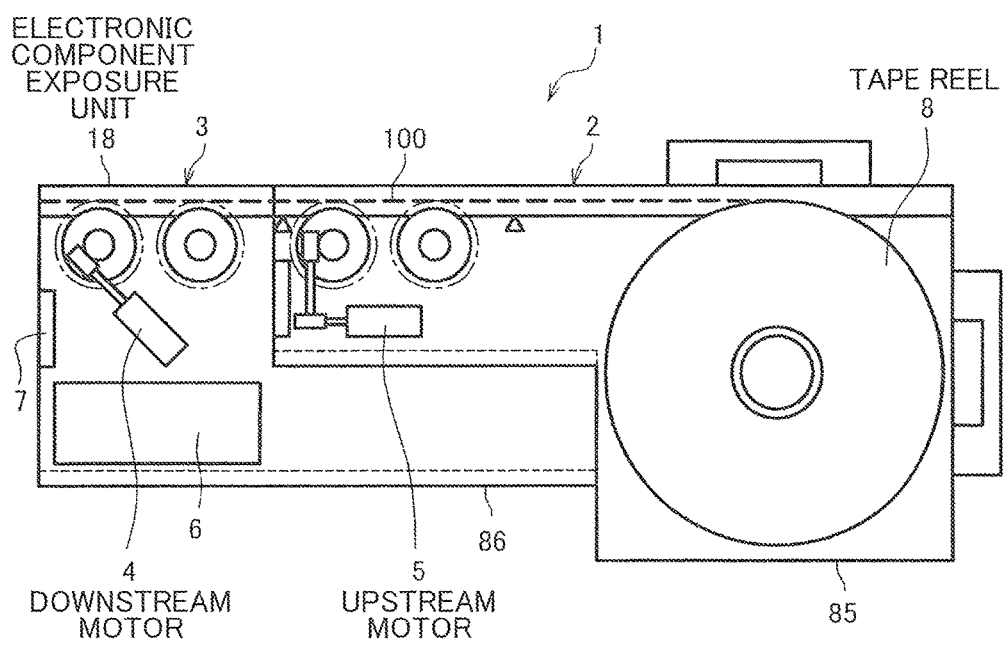
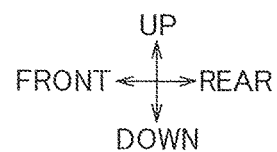

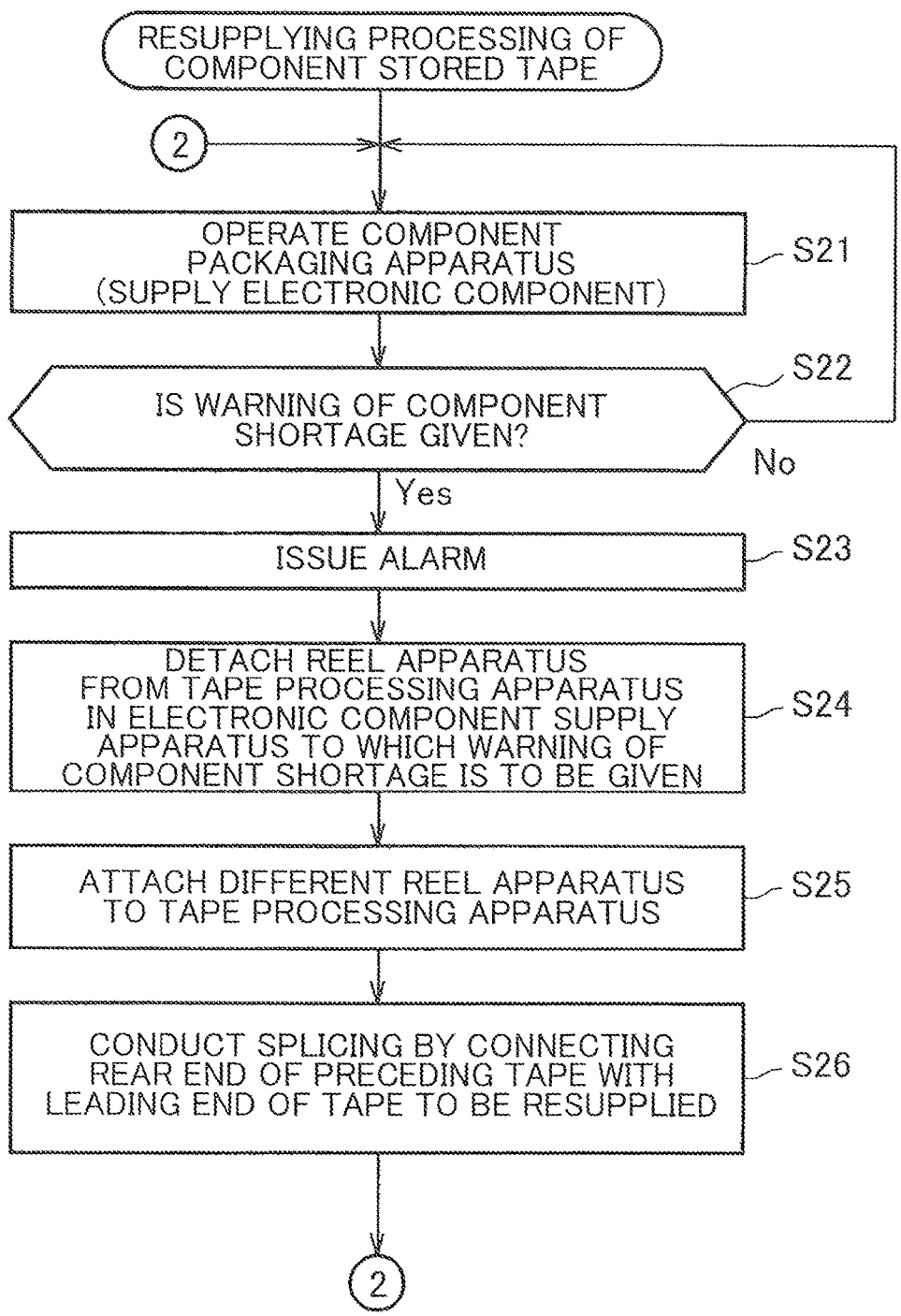

ELECTRONIC COMPONENT SUPPLY APPARATUS, REEL APPARATUS, TAPE PROCESSING APPARATUS, AND METHOD FOR RESUPPLYING COMPONENT STORED TAPE

CROSS REFERENCE TO RELATED APPLICATIONS

This application claims benefit of priority to Japanese Patent Application 2014-262524 filed Dec. 25, 2014, and to International Patent Application No. PCT/JP2015/078248 filed Oct. 5, 2015, the entire content of which is incorporated herein by reference.

TECHNICAL FIELD

The present disclosure relates to an electronic component supply apparatus, a reel apparatus, a tape processing apparatus, and a method for resupplying a component stored tape, and relates to, for example, an electronic component supply apparatus to be applied to a component mounting apparatus for mounting an electronic component on a board to produce an electronic circuit board.

BACKGROUND

An electronic component supply apparatus is used in a component mounting apparatus (chip mounter) for producing an electronic circuit board by mounting an electronic component on a board having a circuit pattern formed thereon. This electronic component supply apparatus is for supplying an electronic component to be mounted on a board. Since various kinds of electronic components are handled with a component mounting apparatus, a plurality of electronic component supply apparatuses are provided in the component mounting apparatus in line with the number of electronic components to be handled by the component mounting apparatus.

A component mounting apparatus includes a component mounting head for taking out an electronic component supplied by an electronic component supply apparatus and moves the electronic component onto a board so as to be mounted at a predetermined position. The electronic component supply apparatus feeds a component stored tape which includes and stores an electronic component such that the electronic component comes to a take-out position thereof, as well as externally exposes the electronic component stored in the component stored tape such that the component mounting head can take out the electronic component. Background art of this technical field includes Japanese Patent Application Publication No. 2013-225716 below.

On a tape feeder (electronic component supply apparatus) recited in Japanese Patent Application Publication No. 2013-225716, a first part is mounted, the first part including a reel holding unit for holding a reel on which a tape-shaped component (component stored tape) is wound, and a component supply unit (electronic component exposure unit) from which an electronic component is taken out. On the tape feeder, a second part is also mounted, the second part including a tape-shaped component feeding apparatus for feeding the component stored tape to the electronic component exposure unit. The first and second parts can be separated from each other, with the first part detachable from the second part that is commonly used with the first part.

However, in the electronic component supply apparatus recited in Japanese Patent Application Publication No. 2013-225716, the reel holding unit and the electronic component exposure unit included in the first part cannot be separated from each other. Accordingly, when the electronic component supply apparatus is resupplied with a new component stored tape of the same kind, or a component stored tape of a different kind, the first part including both the reel holding unit and the electronic component exposure unit should be replaced as a whole. This replacement work might displace a disposition position of the electronic component exposure unit, i.e. an electronic component take-out position. As a result, in electronic component take-out operation by a component mounting head, there might occur defective component take-out, or a need to again instruct a system about an electronic component take-out position.

SUMMARY

An object of the present disclosure is to provide an electronic component supply apparatus capable of reliably taking out and supplying an electronic component stored in a component stored tape, a reel apparatus, a tape processing apparatus, and a method for resupplying a component stored tape.

An electronic component supply apparatus according to one aspect of the present disclosure is characterized in including a reel apparatus having a tape reel with a component stored tape wound thereon, the component stored tape storing electronic components, and a tape processing apparatus having an electronic component exposure unit which exposes the electronic components, that are stored in the component stored tape fed from the reel apparatus, so as to be taken out from the component stored tape, in which the reel apparatus is detachable from the tape processing apparatus.

A reel apparatus according to another aspect of the present disclosure is characterized in having a tape reel with a component stored tape wound thereon, the component stored tape storing electronic components, and in being detachable from a tape processing apparatus having an electronic component exposure unit which exposes the electronic components, that are stored in the component stored tape fed from the tape reel, so as to be taken out from the component stored tape.

A tape processing apparatus according to still another aspect of the present disclosure is characterized in having an electronic component exposure unit which exposes electronic components, that are stored in a component stored tape that stores the electronic components, so as to be taken out from the component stored tape, and in being detachable from a reel apparatus having a tape reel with the component stored tape wound thereon, the component stored tape being fed toward the electronic component exposure unit.

A method for resupplying a component stored tape according to still another aspect of the present disclosure is characterized as including a tape processing apparatus having an electronic component exposure unit which exposes electronic components that are stored in the component stored tape, so as to be taken out from the component stored tape. A reel apparatus has a tape reel with the component stored tape wound thereon. The component stored tape is fed toward the electronic component exposure unit. The method includes a step of supplying the electronic component, a step of detaching the reel apparatus from the tape processing apparatus having the reel apparatus attached thereto, and a step of attaching a different reel apparatus to the tape processing apparatus from which the reel apparatus is detached.

Objects, features and effects of the present disclosure will become more apparent from the following detailed description and accompanying drawings.

BRIEF DESCRIPTION OF DRAWINGS

FIG. 4 is a drawing illustrating a configuration of the electronic component supply apparatus in a state where the tape processing apparatus is attached to the reel apparatus.

FIG. 29 is a flow chart showing a processing procedure of executing a method for resupplying a component stored tape in the fifth embodiment of the present disclosure.

DETAILED DESCRIPTION

Figure 1:
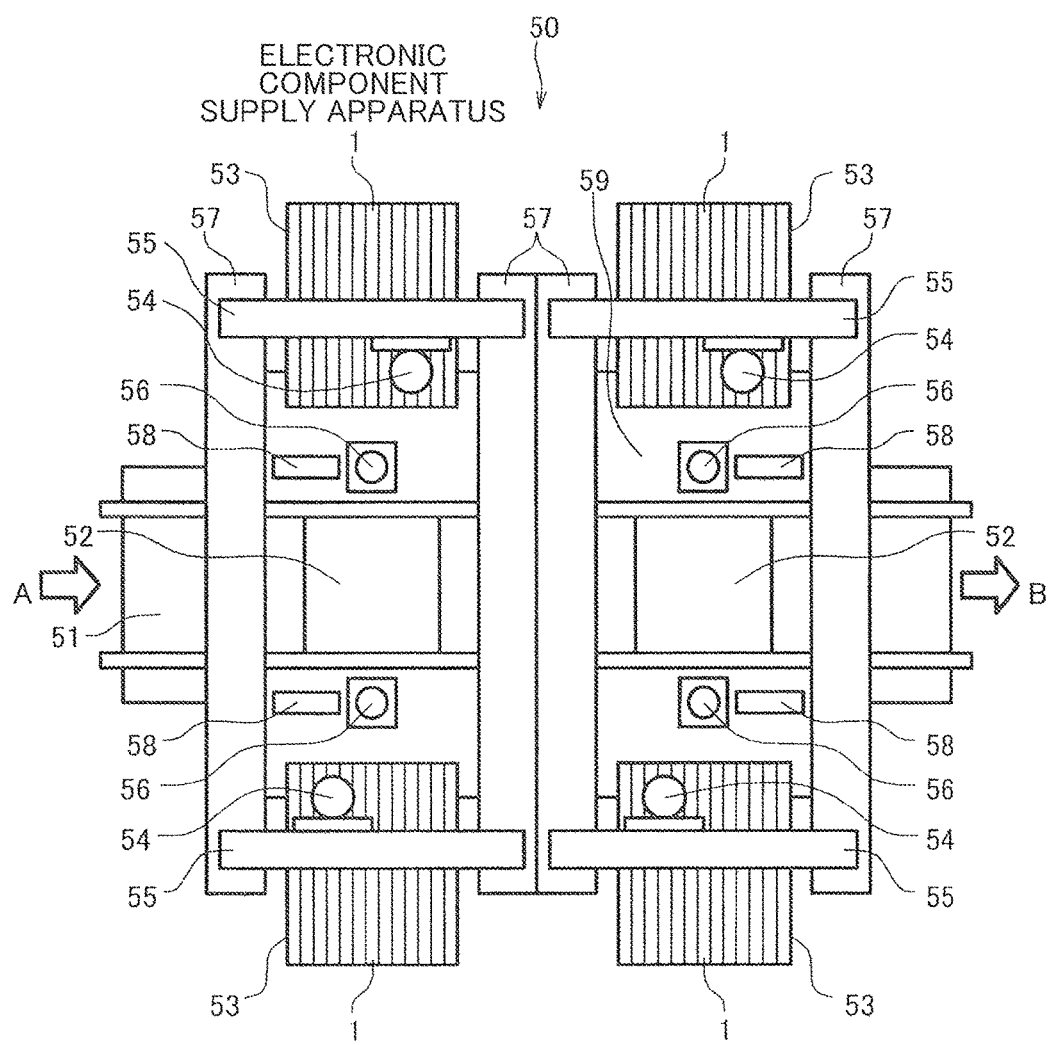
FIG. 1 is a plan view showing a configuration of a component mounting apparatus to which an electronic component supply apparatus according to a first embodiment of the present disclosure is applied.

Embodiments of the present disclosure will be described in detail with reference to the drawings as necessary. In the following drawings, like members or corresponding members are identified by the same reference numerals to omit overlapping description thereof as necessary. Sizes and shapes of the members may be schematically represented so as to be modified or emphasized for convenience of explanation.

First Embodiment

FIG. 1 is a plan view showing a configuration of a component mounting apparatus 50 to which an electronic component supply apparatus 1 according to a first embodiment of the present disclosure is applied. As shown in FIG. 1, the component mounting apparatus 50 is an apparatus for mounting an electronic component 105 (see FIG. 2) on a board 52 to produce an electronic circuit board.

Specifically, the component mounting apparatus 50 automatically mounts (attaches) the electronic component 105 at a predetermined position (a part to which cream solder is applied) of the board 52 transported by a board transport conveyer 51. On the board 52 formed from epoxy resin or the like, a circuit pattern of copper foil or the like is formed by etching, printing, or the like.

The board 52 on which the electronic component 105 is mounted with cream solder interposed therebetween is heated within a furnace (not shown) in a later step. This results in soldering the electronic component 105 to the board 52 to manufacture an electronic circuit board with the electronic component 105 mounted.

On a base 59 of the component mounting apparatus 50, a pair of component supply units 53 is provided on both sides so as to be opposed to each other with the board transport conveyer 51 (extending in a horizontal direction on the sheet of FIG. 1) provided therebetween. FIG. 1 shows an example in which two sets (two stages) of the pairs of component supply units 53 are disposed along a transport direction of the board 52.

A plurality of the electronic component supply apparatuses 1 are aligned along the transport direction of the board 52 so as to be detachable from the component supply unit 53 and supply each of the various electronic components 105 to a take-out position (component attracting position) of each of the electronic components. These electronic component supply apparatuses 1 are arranged in parallel so as to be adjacent to each other with a slight gap (a gap of approximately 1 mm or less).

The board transport conveyer 51 has a transport device which transports the board 52, and a board holding device which positions and holds the board 52 transported from a direction of an arrow A at a predetermined position (neither is shown). After the electronic component 105 is attached on the board 52, the board transport conveyer 51 transports the board 52 in a direction of an arrow B.

Figure 2:
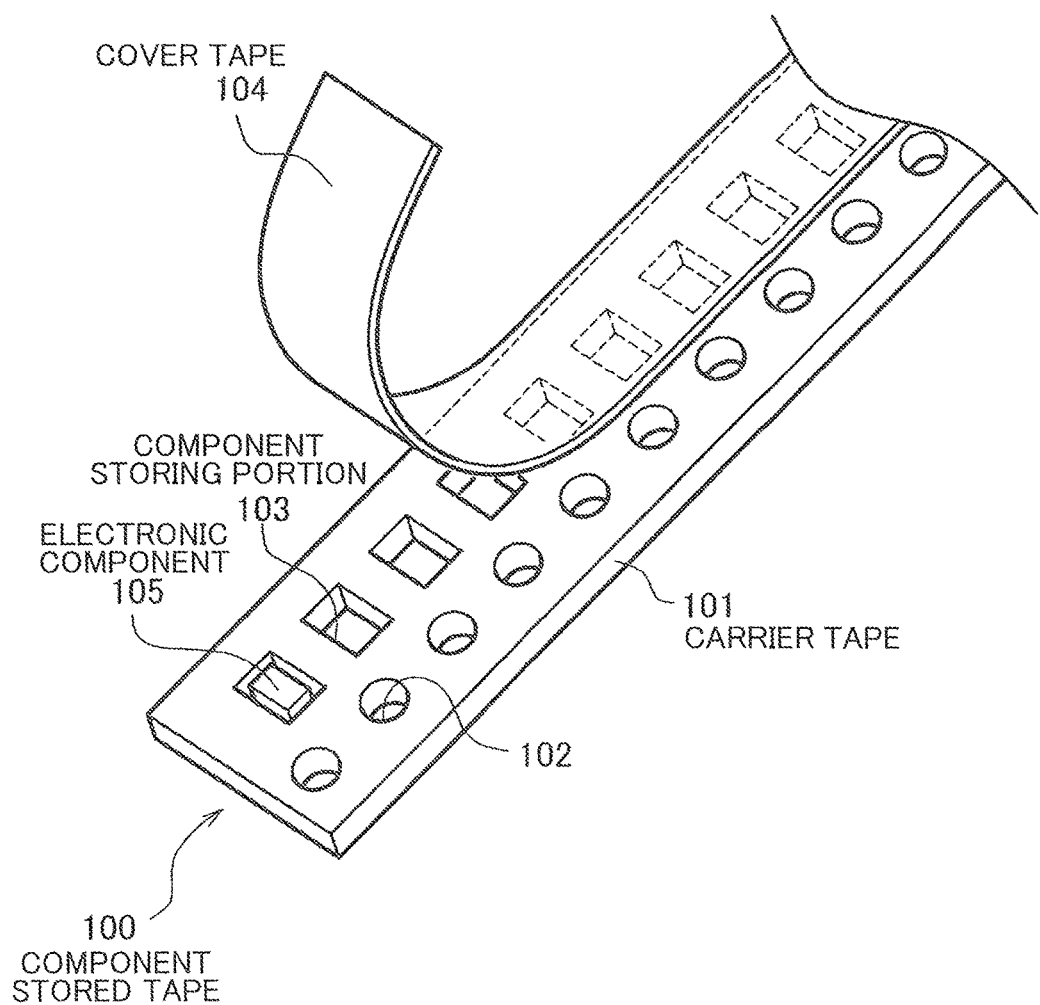
FIG. 2 is a perspective view showing a state where a component stored tape wound on a tape reel provided in the electronic component supply apparatus is fed out from the tape reel.

FIG. 2 is a perspective view showing a state where a component stored tape 100 wound on a tape reel 8 (see FIG. 4) provided in the electronic component supply apparatus 1 is fed out from the tape reel 8. The component stored tape 100 has a carrier tape 101 including the electronic component 105 stored in a component storing portion 103, and a cover tape 104 which covers the component storing portion 103 storing the electronic component 105. In FIG. 2, only the electronic component 105 stored in the component storing portion 103 at the front is shown for the sake of simplicity.

A plurality of recessed component storing portions 103 are aligned along a longitudinal direction of the carrier tape 101. In one side of the carrier tape 101 along the longitudinal direction, a plurality of transporting force transmission holes 102 for applying a transporting force to the carrier tape 101 are aligned.

The cover tape 104 is adhered to the carrier tape 101 so as to cover an upper opening of the component storing portion 103 storing the electronic component 105. This prevents the electronic component 105 from falling out during movement of the component stored tape 100, as well as protects the electronic component 105 from an environmental effect (e.g. humidity).

In an initial state, the component stored tape 100 provided in the electronic component supply apparatus 1 is wound on the tape reel 8 as described above. When the component stored tape 100 in the electronic component supply apparatus 1 enters into an operation state, a transporting force is applied to the component stored tape 100 through the transporting force transmission holes 102, and the component stored tape 100 is fed out. The component stored tape 100 is transported such that the electronic component 105 comes to a take-out position thereof, and the electronic component 105 is exposed so as to be taken out from the component stored tape 100. Thereafter, the electronic component 105 in the component storing portion 103 of the component stored tape 100 is attracted by vacuum suction with a nozzle 81 (see FIG. 10) of a component mounting head 54 (see FIG. 1) and taken out.

As shown in FIG. 1, a pair of X beams 55 is disposed opposed to each other with the board transport conveyer 51 provided therebetween, the beams extending along a direction in which the board 52 is transported (a direction of the arrows A and B). The pair of X beams 55 is located above the board transport conveyer 51 (a front side of a direction vertical to the sheet of FIG. 1).

At both end portions of the X beam 55, actuators (not shown) (e.g. linear motors) are attached. This actuator supports the X beam 55 so as to be movable along a Y beam 57 in a direction orthogonal to a direction in which the board 52 is transported (the direction of the arrows A and B) (the orthogonal direction is a vertical direction on the sheet of FIG. 1). Accordingly, the X beam 55 is allowed to go back and forth between the component supply unit 53 and the board 52.

On the X beam 55, the component mounting head 54 is disposed. The component mounting head 54 is moved by an actuator (not shown) (e.g. a linear motor) along a longitudinal direction (extending direction) of the X beam 55. An end of the component mounting head 54 (at a rear side of the component mounting head 54 shown in FIG. 1 in the direction vertical to the sheet of FIG. 1) is provided with a plurality of the nozzles 81 (see FIG. 10) for attracting the electronic component 105 (see FIG. 2) in the component storing portion 103 of the component stored tape 100 described above. Further, the component mounting head 54 is moved by the actuator of the X beam 55 described above along an extending direction of the Y beam 57.

Thus, the component mounting head 54 moves in a horizontal direction (a direction parallel to the sheet of FIG. 1). Accordingly, the electronic component 105 supplied from the electronic component supply apparatus 1 disposed in the component supply unit 53 is attracted to the nozzle 81 of the component mounting head 54, and then moved in the horizontal direction so as to be transported to a predetermined position (mounting position) of the board 52 to be mounted.

Then, after the electronic component 105 is pressed by the component mounting head 54 to the predetermined position (a part to which cream solder is applied) of the board 52 to be mounted, a vacuum of the nozzle 81 is released. This makes the electronic component 105 be mounted on the board 52.

Between the component supply unit 53 and the board transport conveyer 51, a recognition camera 56 and a nozzle retaining unit 58 are arranged.

The recognition camera 56 is, for example, a CCD (Charge Coupled Device) camera, for acquiring position deviation information of the electronic component 105 attracted to the component mounting head 54. Using a captured image of the electronic component 105 attracted to the component mounting head 54, which is taken by the recognition camera, the following is checked: how much the electronic component 105 deviates in the board transport direction (the direction of the arrows A and B) and in a direction orthogonal to the board transport direction, or how large a rotation angle of the electronic component 105 is. It goes without saying that it is also possible to check whether the electronic component 105 is attracted to the component mounting head 54 or not using an image captured by the recognition camera 56.

When the component mounting head 54 moves above the board 52 from the component supply unit 53 toward the extending direction of the X beam 55 or the extending direction of the Y beam 57, the component mounting head 54 passes over the recognition camera 56. During the passage, the recognition camera 56 captures an image of the electronic component 105 to acquire position deviation information or the like.

The nozzle retaining unit 58 retains a plurality of the nozzles 81 (see FIG. 10) attached to the component mounting head 54, which nozzles are necessary to attract the various electronic components 105. For example, when being instructed to replace a nozzle to a different nozzle adapted to a specific electronic component 105, the component mounting head 54 independently moves in the extending direction of the X beam 55 and the extending direction of the Y beam 57 to move to the nozzle retaining unit 58. Then, the nozzle 81 attached to the component mounting head 54 is replaced with the designated nozzle which is retained in the nozzle retaining unit 58.

Figure 3:
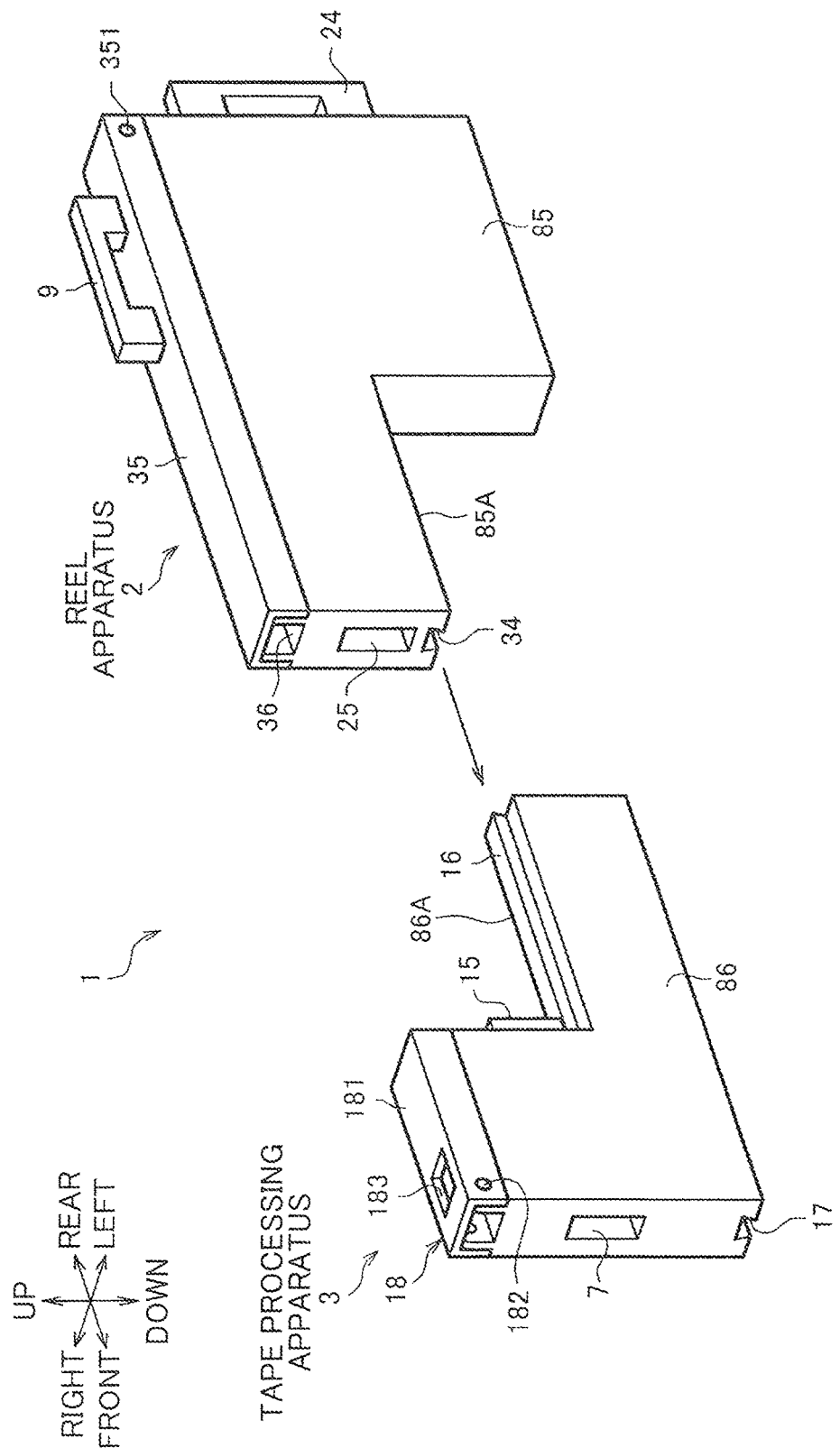
FIG. 3 is a perspective view of an appearance of the electronic component supply apparatus in a state where a reel apparatus and a tape processing apparatus are separated from each other.

FIG. 3 is a perspective view of an appearance of the electronic component supply apparatus 1 in a state where a reel apparatus 2 and a tape processing apparatus 3 are separated from each other. For clearer description, as shown in FIG. 3, front-rear, horizontal, and vertical directions are set. Herein, the vertical direction is coincident with a perpendicular direction. The front-rear direction is a direction orthogonal to the board transport direction (the direction of the arrows A and B) in FIG. 1, with "front" representing a direction closer to the board transport conveyer 51, "rear" representing a direction distant from the board transport conveyer 51. The horizontal direction is a direction along the board transport direction (the direction of the arrows A and B) in FIG. 1.

As shown in FIG. 3, the electronic component supply apparatus 1 includes the reel apparatus 2 and the tape processing apparatus 3. The reel apparatus 2 is detachable from the tape processing apparatus 3. The reel apparatus 2 has a casing 85 for storing various components therein, and the tape processing apparatus 3 has a casing 86 for storing various components therein. The casings 85 and 86 are separable into right and left casings. The casings 85 and 86 are made of, for example, metal such as aluminum alloy. The casing 85 of the reel apparatus 2 has an inverted L-shape and has a backward protrusion 85A. The casing 86 of the tape processing apparatus 3 has an L-shape and has a forward protrusion 86A. When the casings 85 and 86 are integrated, the protrusions 85A and 86A overlap each other in the vertical direction to make a rectangular casing long in the front-rear direction (see FIG. 4).

FIG. 4 is a drawing illustrating a configuration of the electronic component supply apparatus 1 in a state where the tape processing apparatus 3 is attached to the reel apparatus 2. FIG. 4 shows an internal configuration of the electronic component supply apparatus 1 so as to see through the casing 85 and the casing 86 (the same applies to FIG. 5 to FIG. 9, and FIG. 20 to FIG. 26).

The reel apparatus 2 has the tape reel 8 on which the component stored tape 100 that stores the electronic component 105 (see FIG. 2) is wound. In the reel apparatus 2, an upstream motor (motor; a first motor) 5 is disposed for supplying a driving force to feed the component stored tape 100.

The tape processing apparatus 3 has an electronic component exposure unit 18 which exposes the electronic component 105 stored in the component stored tape 100 fed from the reel apparatus 2 so as to be taken out from the component stored tape 100. In the tape processing apparatus 3, a downstream motor (motor; a second motor) 4 is disposed for supplying a driving force to feed the component stored tape 100. Further, the tape processing apparatus 3 has a control board 6 for controlling the downstream motor 4, the upstream motor 5 and the like.

Figure 5:
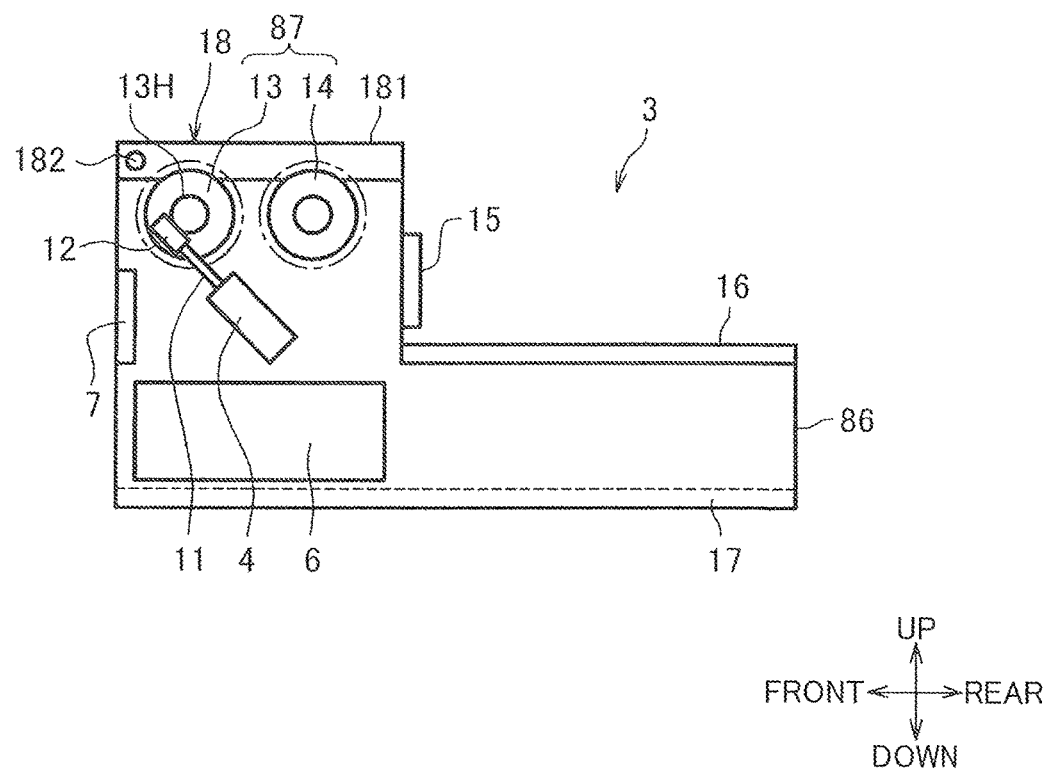
FIG. 5 is a drawing illustrating a configuration of the tape processing apparatus.

FIG. 5 is a drawing illustrating a configuration of the tape processing apparatus 3. The tape processing apparatus 3 includes downstream sprockets 87 having teeth (see FIG. 10) which engage with the transporting force transmission holes 102 (see FIG. 2) of the carrier tape 101 in order to apply a transporting force to the component stored tape 100 (see FIG. 4). The downstream sprockets 87 include a first sprocket 13 and a second sprocket 14. The first sprocket 13 and the second sprocket 14, which are connected so as to be capable of transmitting power, operate synchronously or substantially synchronously. The first sprocket 13 has a worm wheel gear 13H adapted to a worm gear 12. The worm gear 12 meshed with the worm wheel gear 13H is connected to the downstream motor 4 via a motor shaft 11. Accordingly, rotation of the downstream motor 4 causes the first sprocket 13 and the second sprocket 14 to rotate to transport the component stored tape 100.

Figure 12:
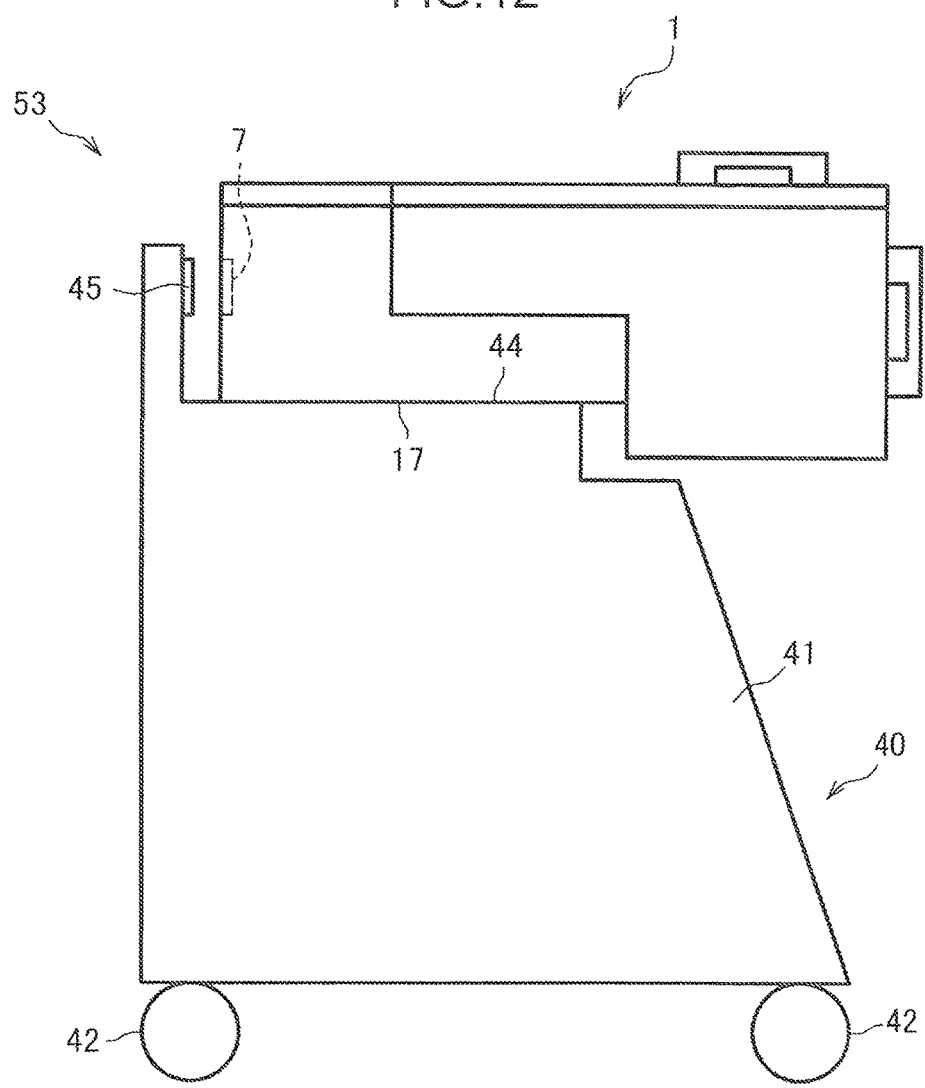
FIG. 12 is a drawing illustrating a configuration of a truck mounted with a plurality of component supply apparatuses.

The casing 86 of the tape processing apparatus 3 is provided with a second positioning slide guide 16 for guiding and positioning the reel apparatus 2 (see FIG. 4), and a first positioning slide guide 17 to be guided and positioned on a truck 40 (see FIG. 12). Although the second positioning slide guide 16 is, for example, a linear convex portion called a dovetail tenon, and the first positioning slide guide 17 is, for example, a linear concave portion called a dovetail groove (see FIG. 3), the guides are not limited thereto.

The tape processing apparatus 3 includes the above-described electronic component exposure unit 18. The electronic component exposure unit 18 includes a cover 181 having an inverted U-shaped section and provided with a take-out port 183 (see FIG. 3) of the electronic component 105 (see FIG. 2). The cover 181 is openable around a center axis of a pin 182 arranged at a front end of the cover 181.

Further, the tape processing apparatus 3 includes a first connector 7 for supplying power to and transmitting/receiving a signal to/from the truck 40 (see FIG. 12), and a second connector 15 for supplying power to and transmitting/receiving a signal to/from the reel apparatus 2 (see FIG. 4).

The thus configured tape processing apparatus 3 enables the component stored tape 100 (see FIG. 4) to be continuously transported, as well as enables the electronic component exposure unit 18 to expose the electronic component 105 (see FIG. 2) in order to take out the electronic component 105.

Figure 6:
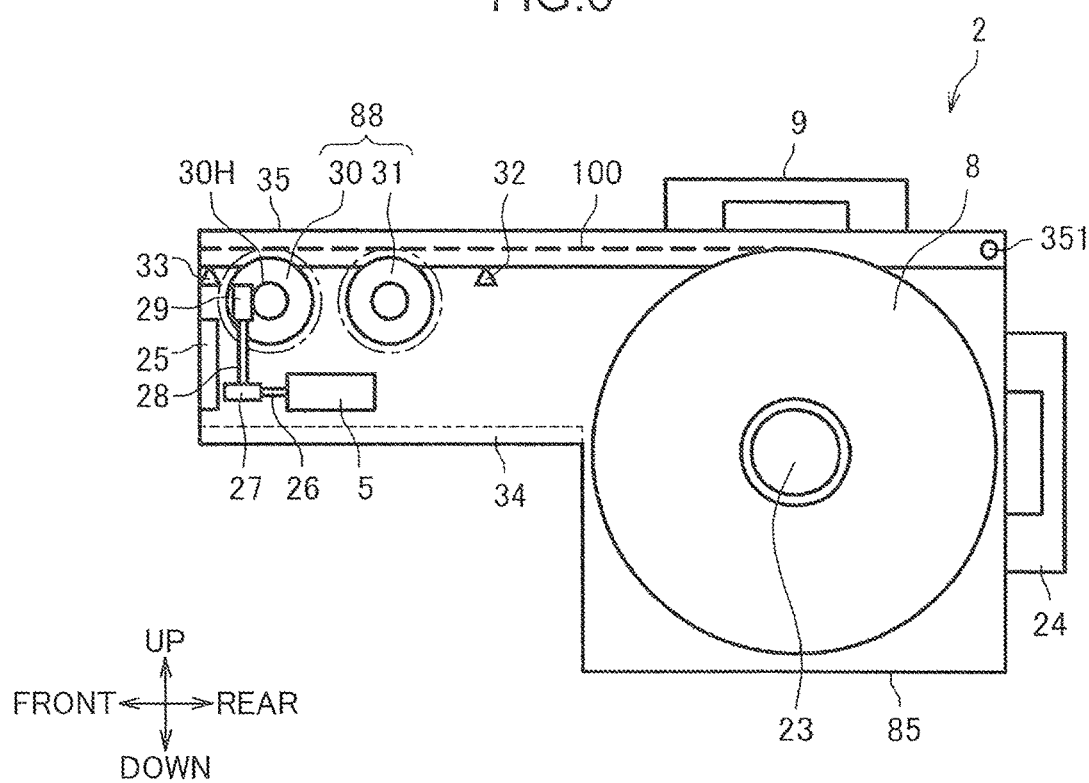
FIG. 6 is a drawing illustrating a configuration of the reel apparatus.

FIG. 6 is a drawing illustrating a configuration of the reel apparatus 2. The reel apparatus 2 includes the above-described tape reel 8. The tape reel 8 is rotatably supported by a tape reel shaft 23 provided in the casing 85. The reel apparatus 2 includes a tape guide cover 35 having an inverted U-shaped section and guides the component stored tape 100. The tape guide cover 35 is openable around a center axis of a pin 351 arranged at a rear end portion of the tape guide cover 35.

The reel apparatus 2 includes upstream sprockets 88 having teeth (see FIG. 10) which engage with the transporting force transmission holes 102 (see FIG. 2) of the carrier tape 101 in order to apply a transporting force to the component stored tape 100. The upstream sprockets 88 include a third sprocket 30 and a fourth sprocket 31. The third sprocket 30 and the fourth sprocket 31, which are connected so as to be capable of transmitting power, operate synchronously or substantially synchronously. The third sprocket 30 includes a worm wheel gear 30H adapted to a worm gear 29. The worm gear 29 meshed with the worm wheel gear 30H is coupled to a shaft 28, and the shaft 28 is connected to the upstream motor 5 via a gear mechanism 27 and a motor shaft 26. As the gear mechanism 27, for example, a pair of bevel gears meshing with each other can be used.

The casing 85 of the reel apparatus 2 is provided with a third positioning slide guide 34 which is to be guided and positioned on the tape processing apparatus 3. Although the third positioning slide guide 34 is a linear concave portion formed of, for example, a dovetail groove (see FIG. 3), the guide is not limited thereto. The third positioning slide guide 34 slidably engages with the second positioning slide guide 16 (see FIG. 5) in the front-rear direction. The reel apparatus 2 includes a third connector 25 for supplying power to and transmitting/receiving a signal to/from the tape processing apparatus 3.

The reel apparatus 2 includes a first grip 9 and a second grip 24 for handling the reel apparatus 2, and the electronic component supply apparatus 1 with the reel apparatus 2 and the tape processing apparatus 3 coupled. Although the first grip 9 and the second grip 24 are handleable by a machine, the grips can be manually handled by an operator. Further, the reel apparatus 2 includes a first sensor 32 and a second sensor 33 for detecting presence/absence of the component stored tape 100.

Figure 7:
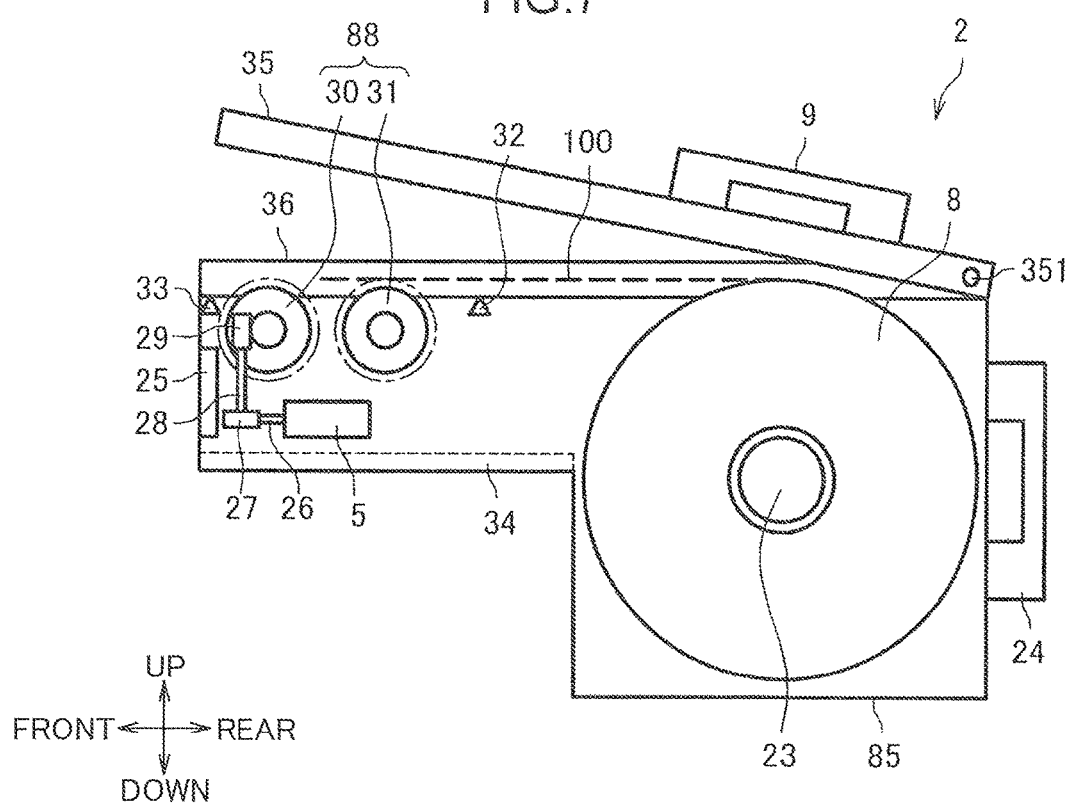
FIG. 7 is a drawing illustrating a procedure of storing a component stored tape in the reel apparatus.
Figure 8:
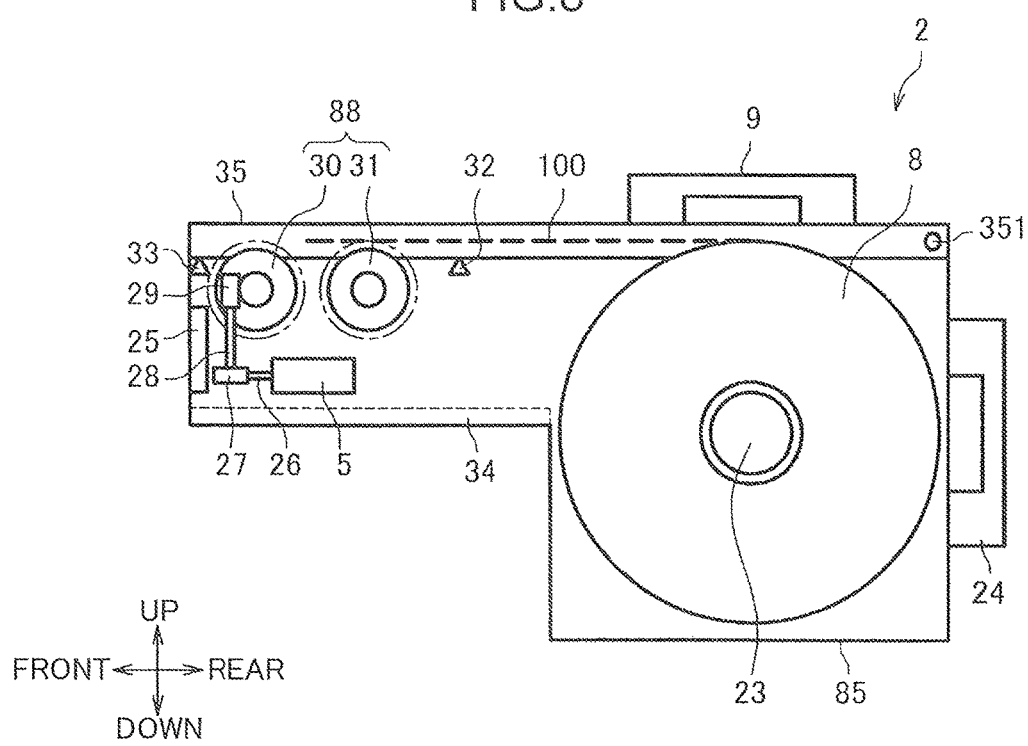
FIG. 8 is a drawing illustrating, subsequently to FIG. 7, the procedure of storing the component stored tape in the reel apparatus.
Figure 9:
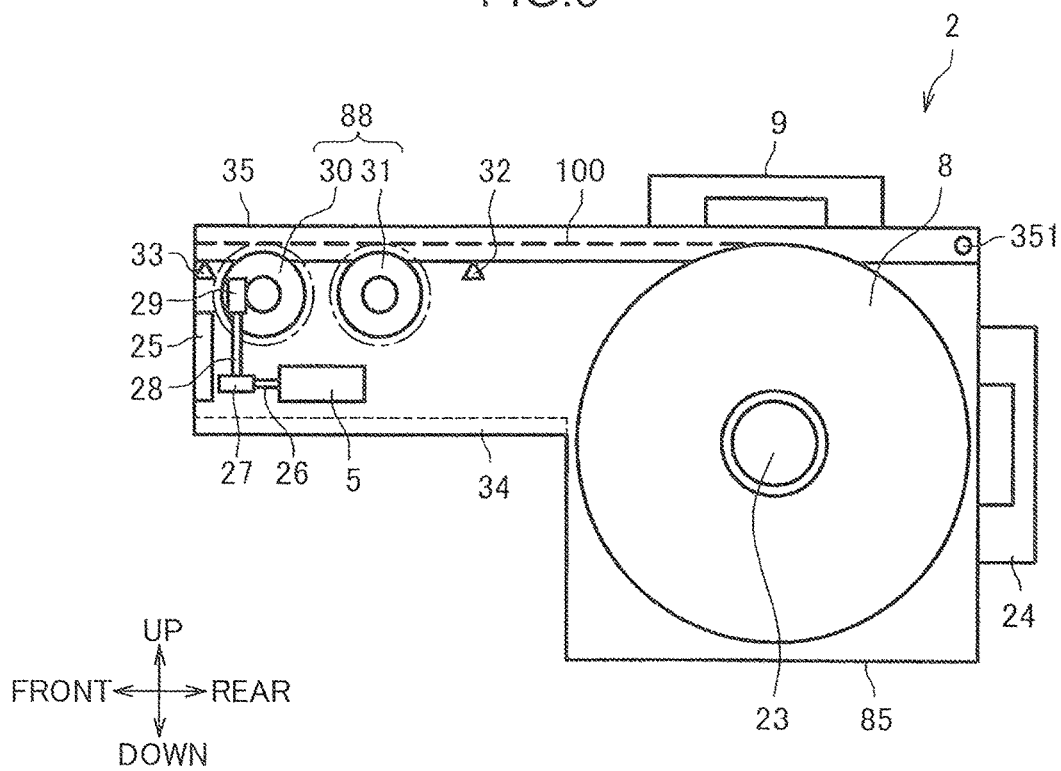
FIG. 9 is a drawing illustrating, subsequently to FIG. 8, the procedure of storing the component stored tape in the reel apparatus.

Next, with reference to FIG. 7 to FIG. 9, description will be made about how the component stored tape 100 moves in the reel apparatus 2. FIG. 7 to FIG. 9 are drawings illustrating a procedure of storing the component stored tape 100 in the reel apparatus 2.

First, the reel apparatus 2 is brought to a state where it is capable of transmitting/receiving power and a signal to/from the third connector 25. Then, as shown in FIG. 7, operation of the first grip 9 by an operator leads to rotation of the tape guide cover 35 around the center axis of the pin 351 so as to be opened upward, the tape guide cover 35 covering a tape guide 36 located in an upper part of the reel apparatus 2 (see also FIG. 3). At this time, a sensor (not shown) senses an open state of the tape guide cover 35, and information that the tape guide cover 35 is in the open state is stored in a control apparatus (not shown). Thereafter, a hole unit provided at the center of the tape reel 8 on which the component stored tape 100 is wound is fitted to the tape reel shaft 23. Then, the component stored tape 100 is fed out from the tape reel 8 to draw a leading end thereof across a position of the fourth sprocket 31.

Subsequently, as shown in FIG. 8, the operator operates the first grip 9 to close the tape guide cover 35. When the tape guide cover 35 is closed, the sensor (not shown) senses a closed state of the tape guide cover 35 to send, to the control apparatus (not shown), information that the tape guide cover 35 is closed. At this time, when the first sensor 32 senses the presence of the component stored tape 100, an operation command is sent to the upstream motor 5 from the control apparatus. Herein, even when the first sensor 32 senses the presence of the component stored tape 100, the control apparatus refrains from sending an operation command to the upstream motor 5 unless the information that the tape guide cover 35 is in the closed state is received.

Subsequently, as shown in FIG. 9, when the operation command is sent to the upstream motor 5, power is transmitted to the third sprocket 30 via the motor shaft 26, the gear mechanism 27, the shaft 28, and the worm gear 29. This leads to rotation of the third sprocket 30 and the fourth sprocket 31 so as to transport the component stored tape 100 in a forward direction. When the upstream sprocket 88 continues rotating to cause the leading end of the component stored tape 100 to arrive at the second sensor 33, the second sensor 33 senses the presence of the component stored tape 100. When the second sensor 33 senses the presence of the component stored tape 100, the control apparatus (not shown) sends a stop command to the upstream motor 5.

As has been described with reference to FIG. 7 to FIG. 9, just setting the tape reel 8 on the reel apparatus 2 enables the component stored tape 100 to automatically stick out the leading end thereof.

Figure 10:
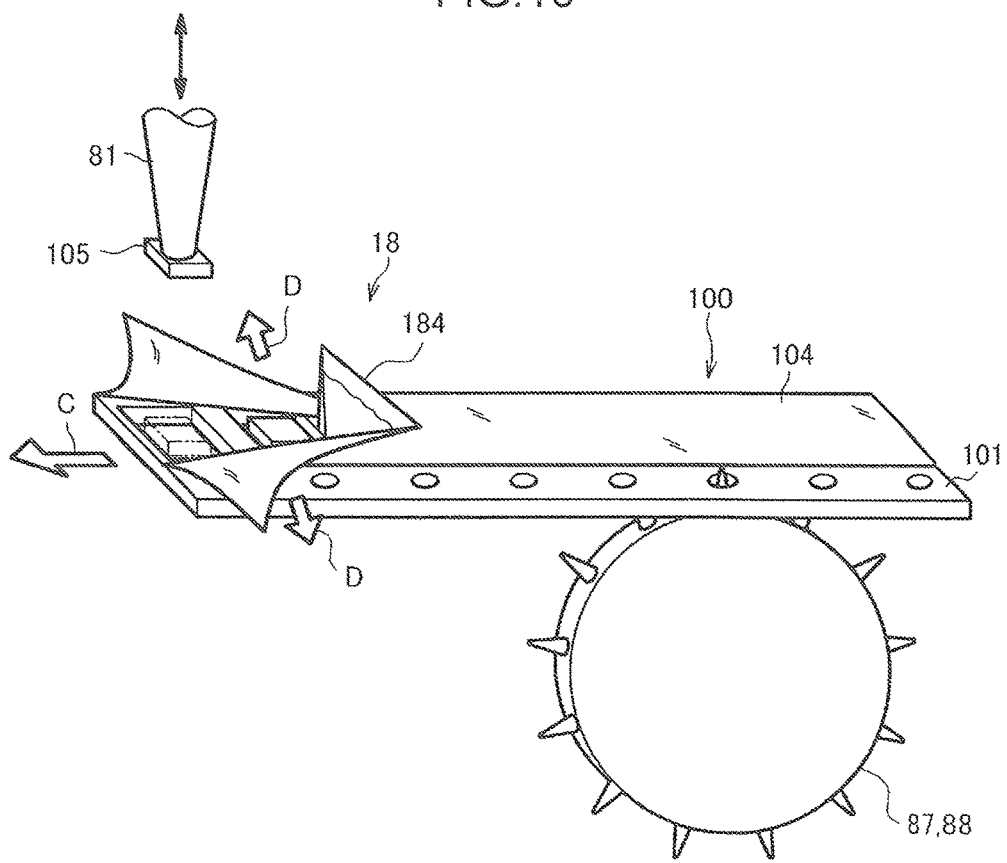
FIG. 10 is a drawing illustrating how an electronic component is exposed.
Figure 11:
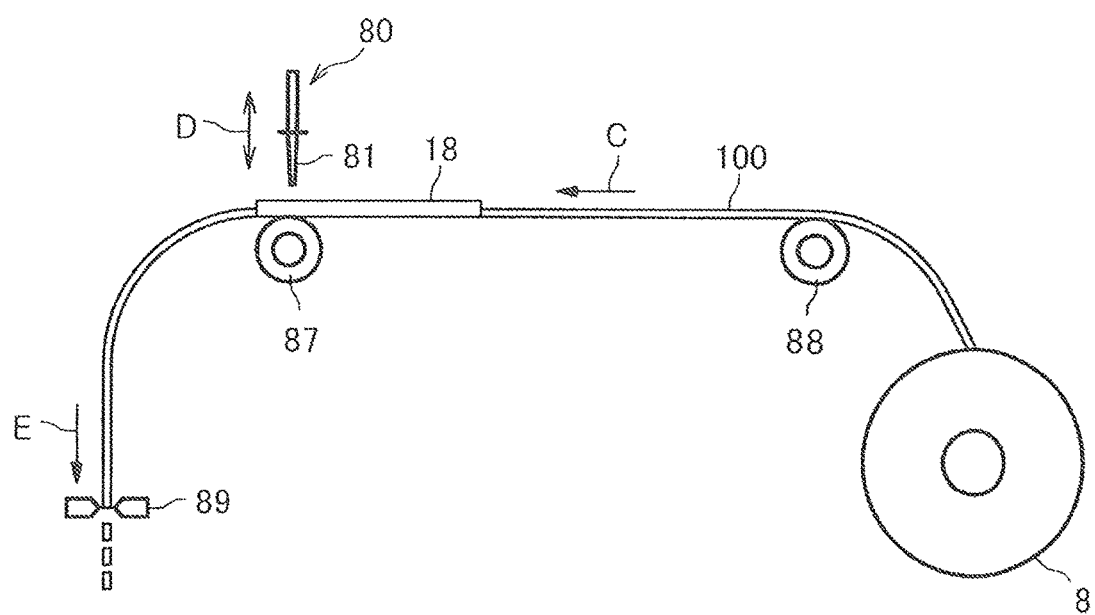
FIG. 11 is a drawing illustrating how the component stored tape is processed.

Next, with reference to FIG. 10 and FIG. 11, further description will be made about a method of exposing the electronic component 105 and a method of processing the component stored tape 100. FIG. 10 is a drawing illustrating how the electronic component 105 is exposed. FIG. 11 is a drawing illustrating how the component stored tape 100 is processed.

The electronic component exposure unit 18 has an edge 184. Cutting the cover tape 104 of the component stored tape 100 with the edge 184 makes the electronic component 105 be exposed. Herein, the component stored tape 100 is transported in a direction of an arrow C by rotation of the downstream sprocket 87 and the upstream sprocket 88. This enables the electronic component exposure unit 18 to cut open a vicinity of the central part in a width direction of the cover tape 104 by the edge 184 in a direction of an arrow D without peeling the cover tape 104 from the carrier tape 101, thereby exposing the electronic component 105 so as to be taken out.

The component stored tape 100 wound on the tape reel 8 is transported in the direction of the arrow C by the downstream sprocket 87 and the upstream sprocket 88. The electronic component exposure unit 18 exposes the electronic component 105 by cutting open the cover tape 104 by the edge 184 to partially peel the cover tape 104 from the carrier tape 101. The exposed electronic component 105 is attracted to and held by the nozzle 81 as a result of up-down movement, in the direction of the arrow D, of a component attracting and attaching device 80 with the nozzle 81 attached to an end thereof. The cover tape 104 cut open by the edge 184 and partially peeled is transported in a direction of an arrow E together with the carrier tape 101 by the rotation of the downstream sprocket 87 and the upstream sprocket 88, and is then cut by a cutter unit 89.

FIG. 12 is a drawing illustrating a configuration of the truck 40 mounted with a plurality of electronic component supply apparatuses 1. The truck 40 mounted with a plurality of the electronic component supply apparatuses 1 is arranged in the component supply unit 53 (see FIG. 1) of the component mounting apparatus 50. The truck 40 includes a holding stand 41 which holds a plurality of the electronic component supply apparatuses 1, and a plurality of wheels 42 which movably support the holding stand 41.

The holding stand 41 is provided with a fourth positioning slide guide 44 which engages with the first positioning slide guide 17 of the electronic component supply apparatus 1 to support and position the electronic component supply apparatus 1. Although the fourth positioning slide guide 44 is, for example, a linear convex portion called a dovetail tenon, the guide is not limited thereto. The holding stand 41 is provided with a fourth connector 45 for the electronic component supply apparatus 1 to transmit/receive power and a signal via the truck 40. Connection of the first connector 7 of the electronic component supply apparatus 1 to the fourth connector 45 of the truck 40 and engagement of the first positioning slide guide 17 with the fourth positioning slide guide 44 leads to positioning the electronic component supply apparatus 1 on the truck 40.

Thus applying the truck 40 to the component supply unit 53 (see FIG. 1) allows the component mounting apparatus 50 to be mounted with a plurality of the electronic component supply apparatuses 1. Allowing a plurality of the electronic component supply apparatuses 1 to be connectable to the truck 40 enables provision of a plurality of kinds of the component stored tapes 100.

Figure 13:
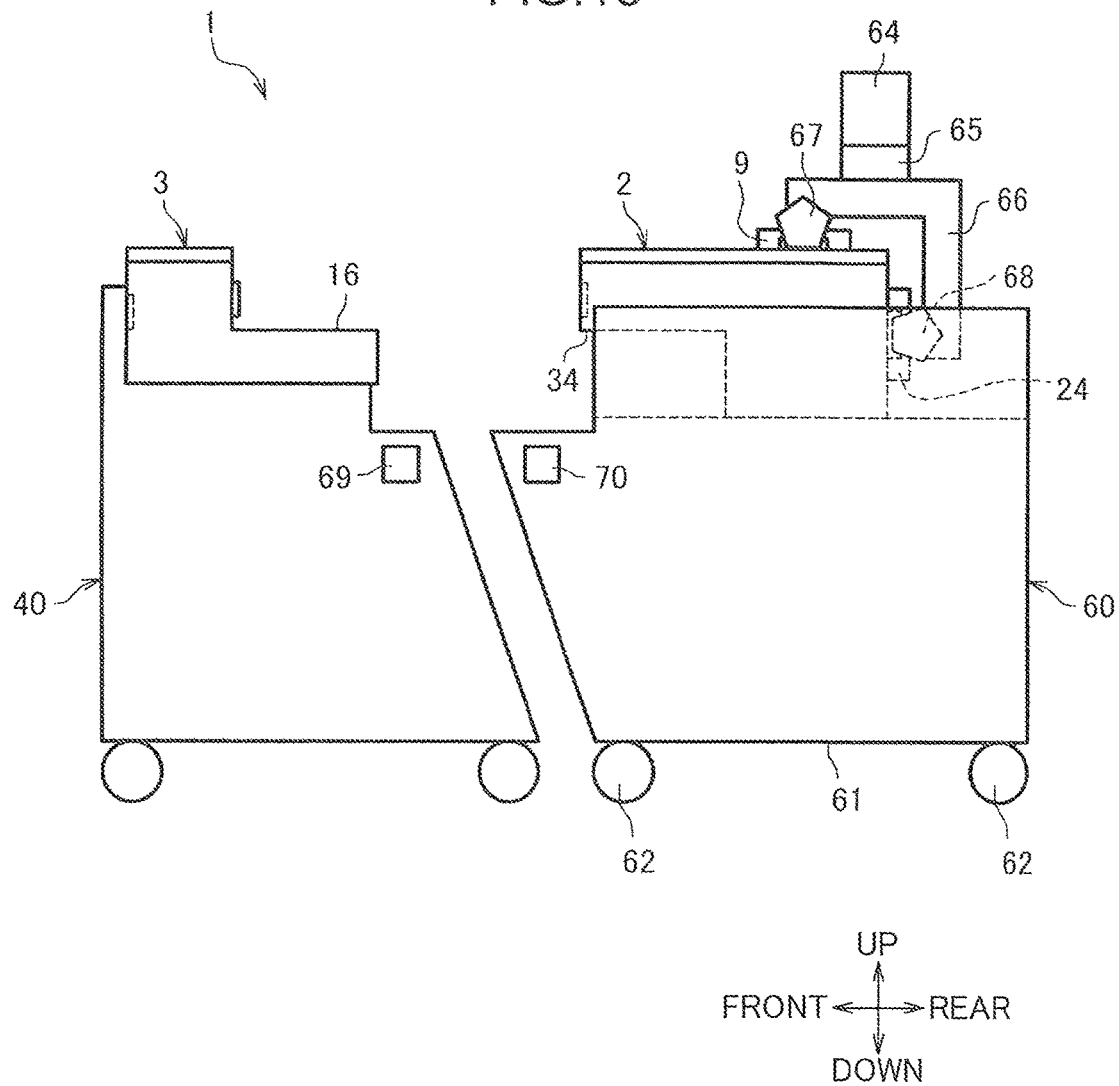
FIG. 13 is a drawing illustrating a configuration of an auto-moving truck disposed behind the truck shown in FIG. 12 so as to be opposed thereto.

FIG. 13 is a drawing illustrating a configuration of the auto-moving truck (truck) 60 disposed behind the truck 40 shown in FIG. 12 so as to be opposed to the truck 40. The auto-moving truck 60 includes a reel apparatus holding stand (reel apparatus holding unit) 61, and a plurality of wheels 62 which support the reel apparatus holding stand 61 so as to be freely movable. On the reel apparatus holding stand 61, a plurality of the reel apparatuses 2 are arranged in parallel along the horizontal direction.

The auto-moving truck 60 includes a first grasping unit 67 and a second grasping unit 68 which grasp the first grip 9 and the second grip 24 of the reel apparatus 2, respectively, an arm 66 which supports the first grasping unit 67 and the second grasping unit 68, a direct acting apparatus 65 which supports the arm 66 so as to be movable in the horizontal direction, and a beam 64 which holds the direct acting apparatus 65. The beam 64 is supported so as to be movable in the front-rear direction by a direct acting apparatus (not shown) which is movable in the front-rear direction.

The auto-moving truck 60 is mounted with a reader 70 for detecting a reference mark 69 provided in the truck 40. For example, the reference mark 69 is provided at each of a plurality of positions in the truck 40 where the tape processing apparatus 3 is to be positioned, and the reader 70 is provided at each of a plurality of positions in the auto-moving truck 60 where the reel apparatus 2 is to be positioned. The reference mark 69, however, can be provided in the auto-moving truck 60, and in this case, the reader 70 is mounted on the truck 40.

As has been described with reference to FIG. 13, the auto-moving truck 60 is positioned at a predetermined position as a result of moving freely so that the reference mark 69 is detected by the reader 70. A position at which the auto-moving truck 60 is positioned is a position at which the third positioning slide guide 34 of the reel apparatus 2 mounted on the auto-moving truck 60 can be fit in the second positioning slide guide 16 of the tape processing apparatus 3. This enables a desired reel apparatus 2 to be positioned at each tape processing apparatus 3.

Figure 14:
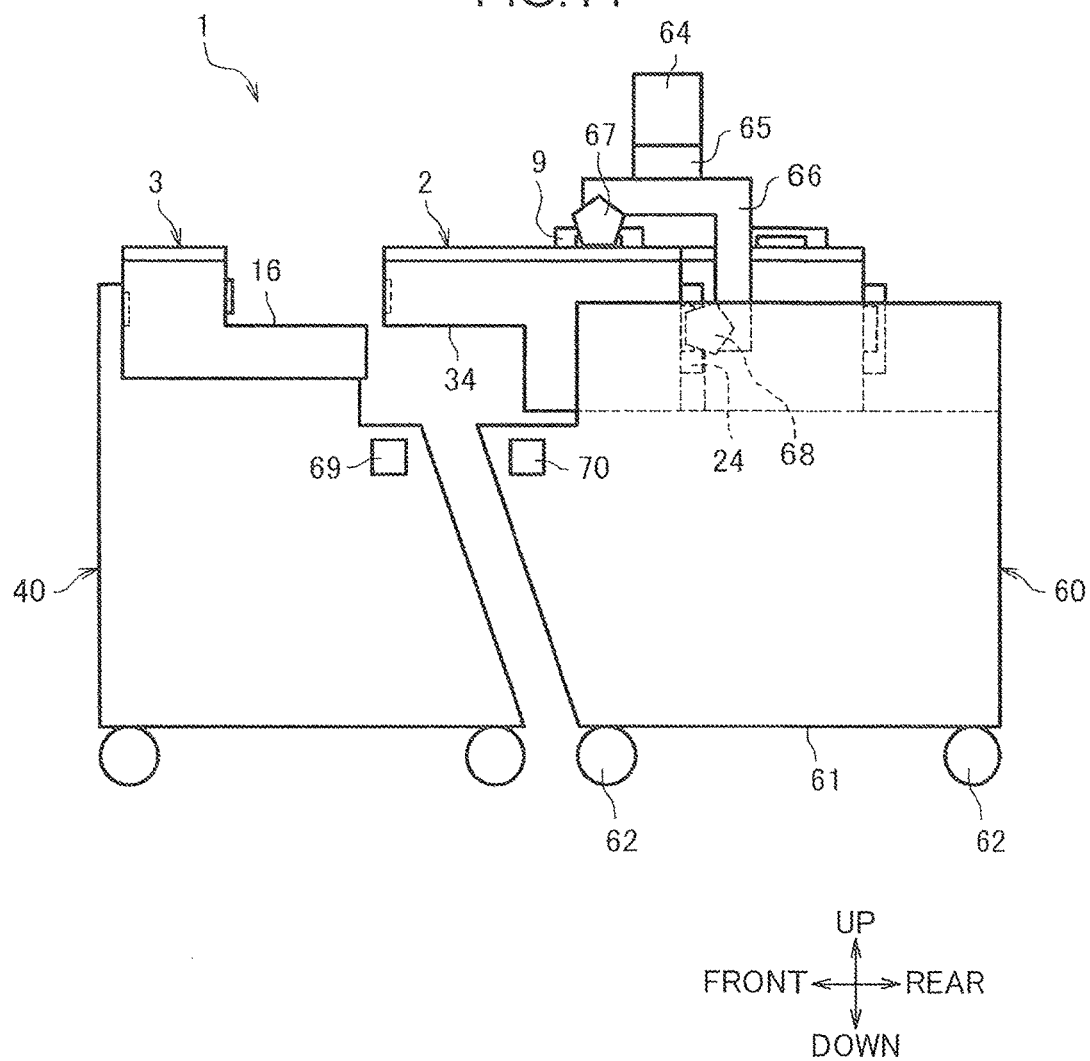
FIG. 14 is a drawing illustrating a method of attaching the reel apparatus held on the auto-moving truck to the tape processing apparatus disposed on the truck.
Figure 15:
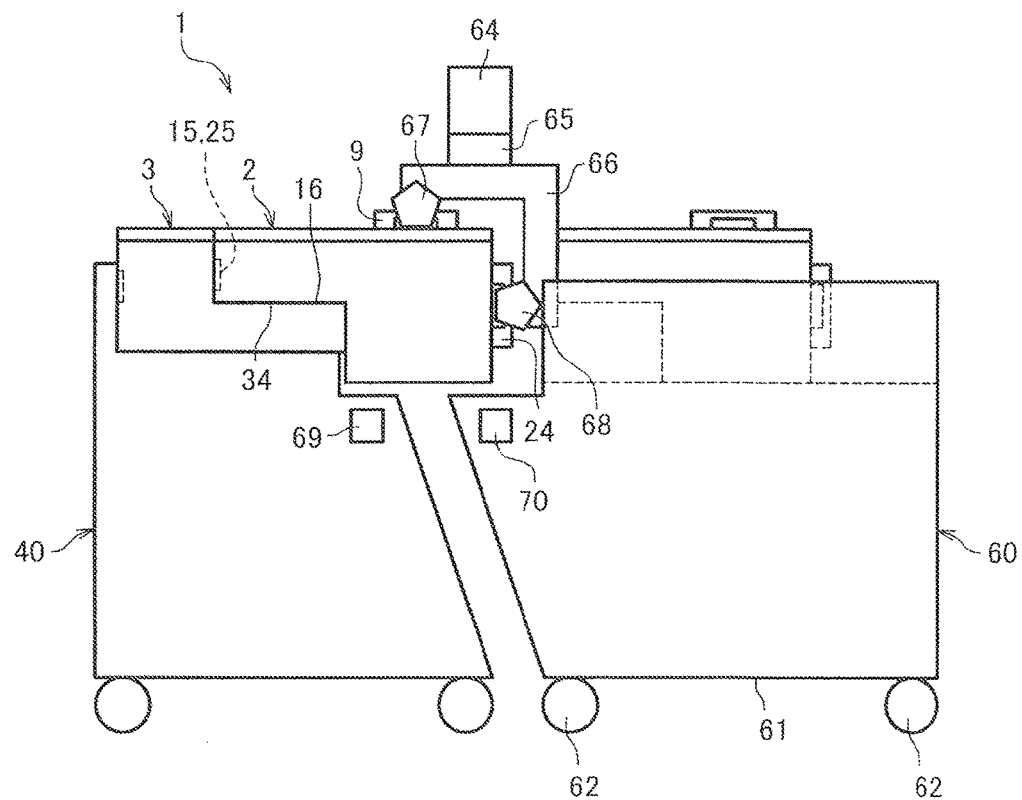
FIG. 15 is a drawing illustrating, subsequently to FIG. 14, the method of attaching the reel apparatus held on the auto-moving truck to the tape processing apparatus disposed on the truck.
Figure 16:
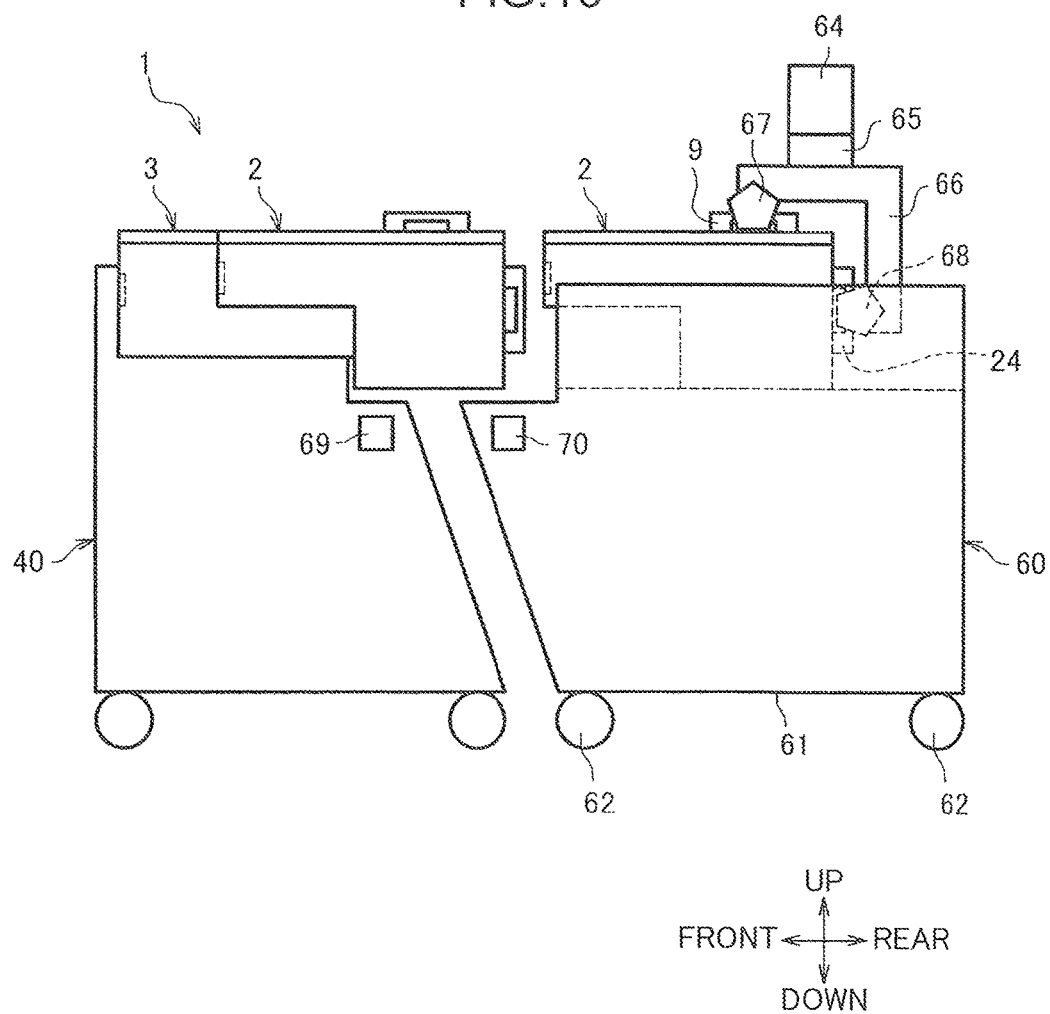
FIG. 16 is a drawing illustrating, subsequently to FIG. 15, the method of attaching the reel apparatus held on the auto-moving truck to the tape processing apparatus disposed on the truck.

Next, with reference to FIG. 13 to FIG. 16, description will be made about a method of attaching the reel apparatus 2 to the tape processing apparatus 3 by using the auto-moving truck 60. FIG. 14 to FIG. 16 are drawings illustrating a method of attaching the reel apparatus 2 held on the auto-moving truck 60 to the tape processing apparatus 3 disposed on the truck 40.

As shown in FIG. 13, when the tape processing apparatus 3 which needs the component stored tape 100 (see FIG. 4) to be resupplied, according to an instruction from the control apparatus 90 (see FIG. 18), the auto-moving truck 60 causes the designated reel apparatus 2 mounted on the auto-moving truck 60 to be positioned at a corresponding position behind the designated tape processing apparatus 3 mounted on the truck 40. Thereafter, the direct acting apparatus 65 mounted on the beam 64 causes the first grasping unit 67 and the second grasping unit 68 supported movably via the arm 66 to grasp the first grip 9 and the second grip 24, respectively.

Subsequently, as shown in FIG. 14, with the first grasping unit 67 and the second grasping unit 68 grasping the reel apparatus 2, a direct acting apparatus (not shown) moves the beam 64 in the forward direction. As shown in FIG. 15, the beam 64 is moved further in the forward direction to connect the second connector 15 with the third connector 25, and the second positioning slide guide 16 is engaged with the third positioning slide guide 34 to position the reel apparatus 2 at the tape processing apparatus 3, and eventually at the truck 40. This completes attachment (setting) of the reel apparatus 2 to the tape processing apparatus 3 to configure the electronic component supply apparatus 1.

Subsequently, as shown in FIG. 16, in the electronic component supply apparatus 1 having been set, grasping with the first grasping unit 67 and the second grasping unit 68 is released. Thereafter, the beam 64 is returned to an original position to prepare for handling a subsequent reel apparatus. In some cases, the auto-moving truck 60 can move to supply a different truck 40 with the component stored tape 100.

Figure 17:
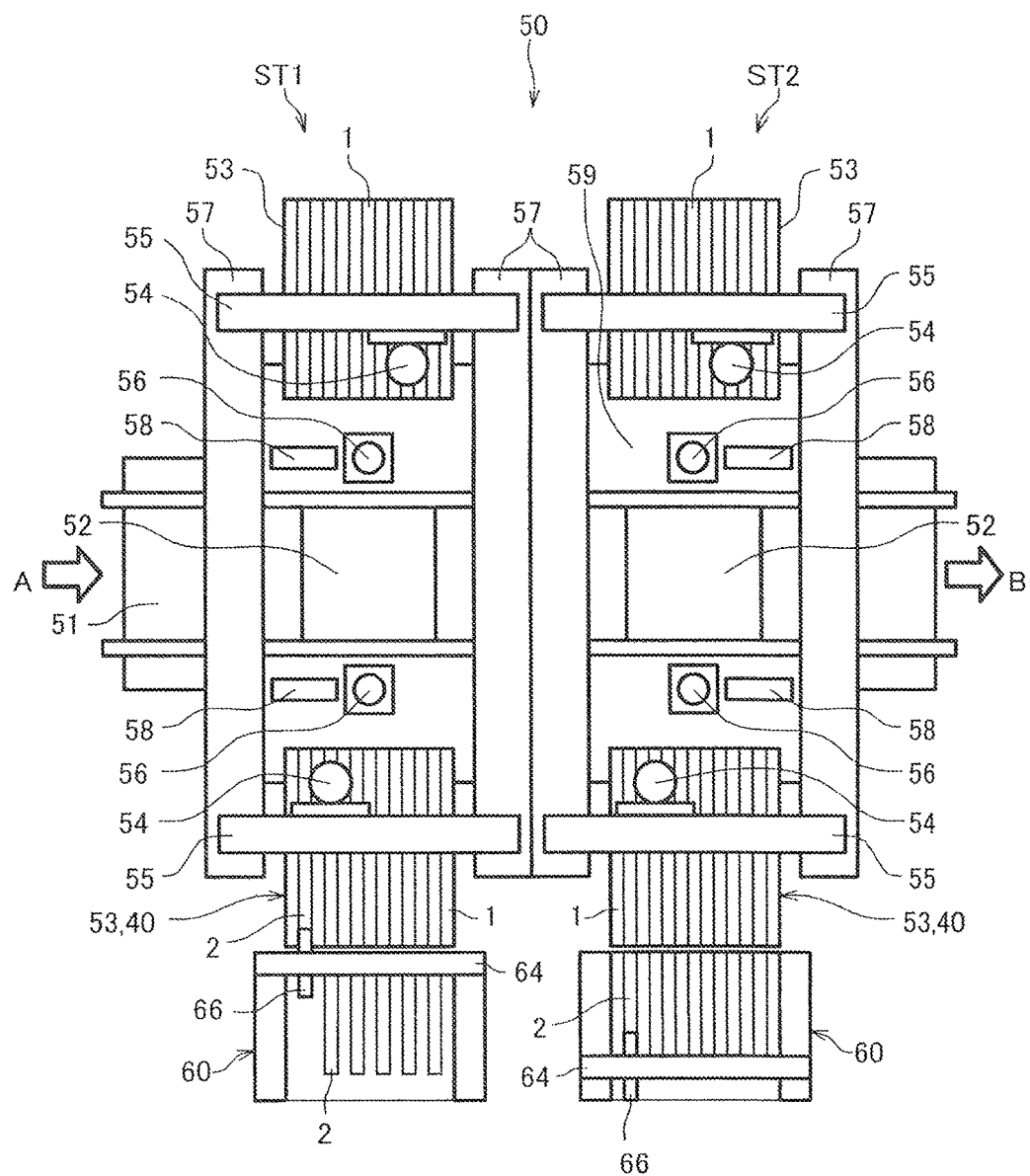
FIG. 17 is a plan view illustrating operation of the auto-moving truck.

FIG. 17 is a plan view illustrating operation of the auto-moving truck 60. The component mounting apparatus 50 includes a plurality of stages ST1 and ST2. In FIG. 17, although two stages are shown for convenience of explanation, the number of stages is not limited thereto, and the component mounting apparatus 50 can include any number of stages. In FIG. 17, although one board transport conveyer 51 is shown, the number of conveyers is not limited thereto, and for example, two board transport conveyers 51 can be provided to simultaneously transport two boards. Further, in FIG. 17, although a plurality of the reel apparatuses 2 arranged in parallel on the auto-moving truck 60 are spaced every other apparatus, arrangement of the apparatuses is not limited thereto and can be appropriately changed.

The board 52 is carried in the component mounting apparatus 50 from the direction of the arrow A in FIG. 17 and carried out for a subsequent step in the direction of the arrow B. In the component supply unit 53 of each of the stages ST1 and ST2 in the component mounting apparatus 50, the truck 40 is arranged. Each of the component supply units 53 includes the truck 40 mounted with a plurality of the electronic component supply apparatuses 1 described above.

For example, the auto-moving truck 60 arranged in the stage ST1 shows a state where the reel apparatus 2 is being supplied from the auto-moving truck 60 to the component supply unit 53. The auto-moving truck 60 arranged in the stage ST2 shows a state where the reel apparatus 2 including the tape reel 8 (see FIG. 4) having finished discharging the component stored tape 100 is recovered from the component supply unit 53 to the auto-moving truck 60. Accordingly, setting up a production system so as to associate a mounting schedule of the board 52 with a schedule for resupplying the component stored tape 100 by the auto-moving truck 60 enables automatic resupplying of the component stored tape 100.

Figure 18:
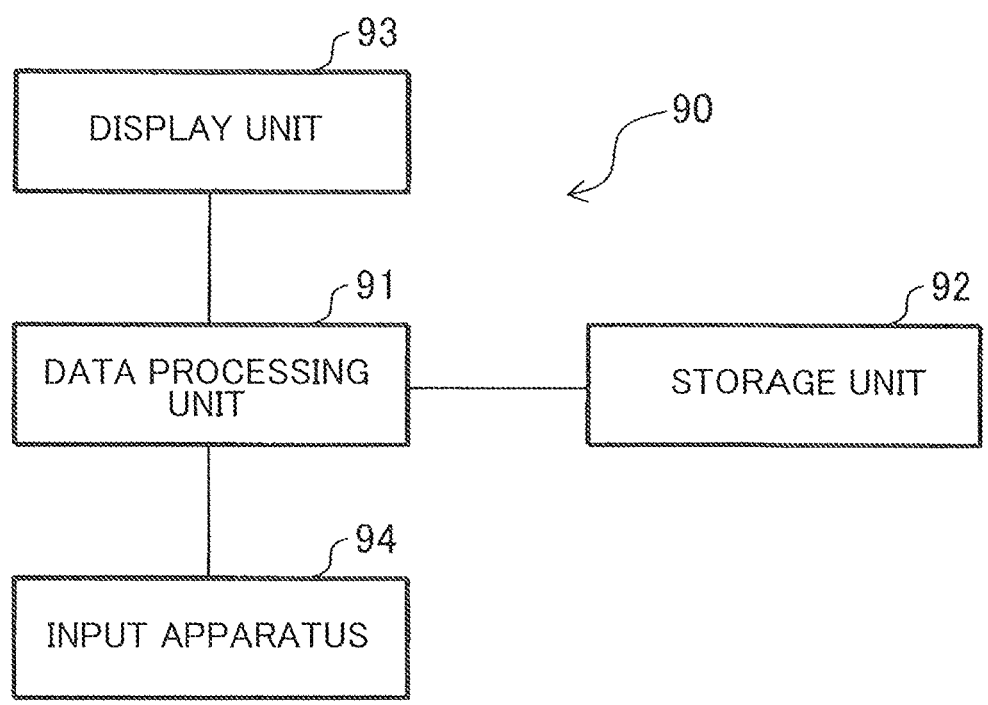
FIG. 18 is a block diagram showing one example of a configuration of a control apparatus attached to the component mounting apparatus.
Figure 19:
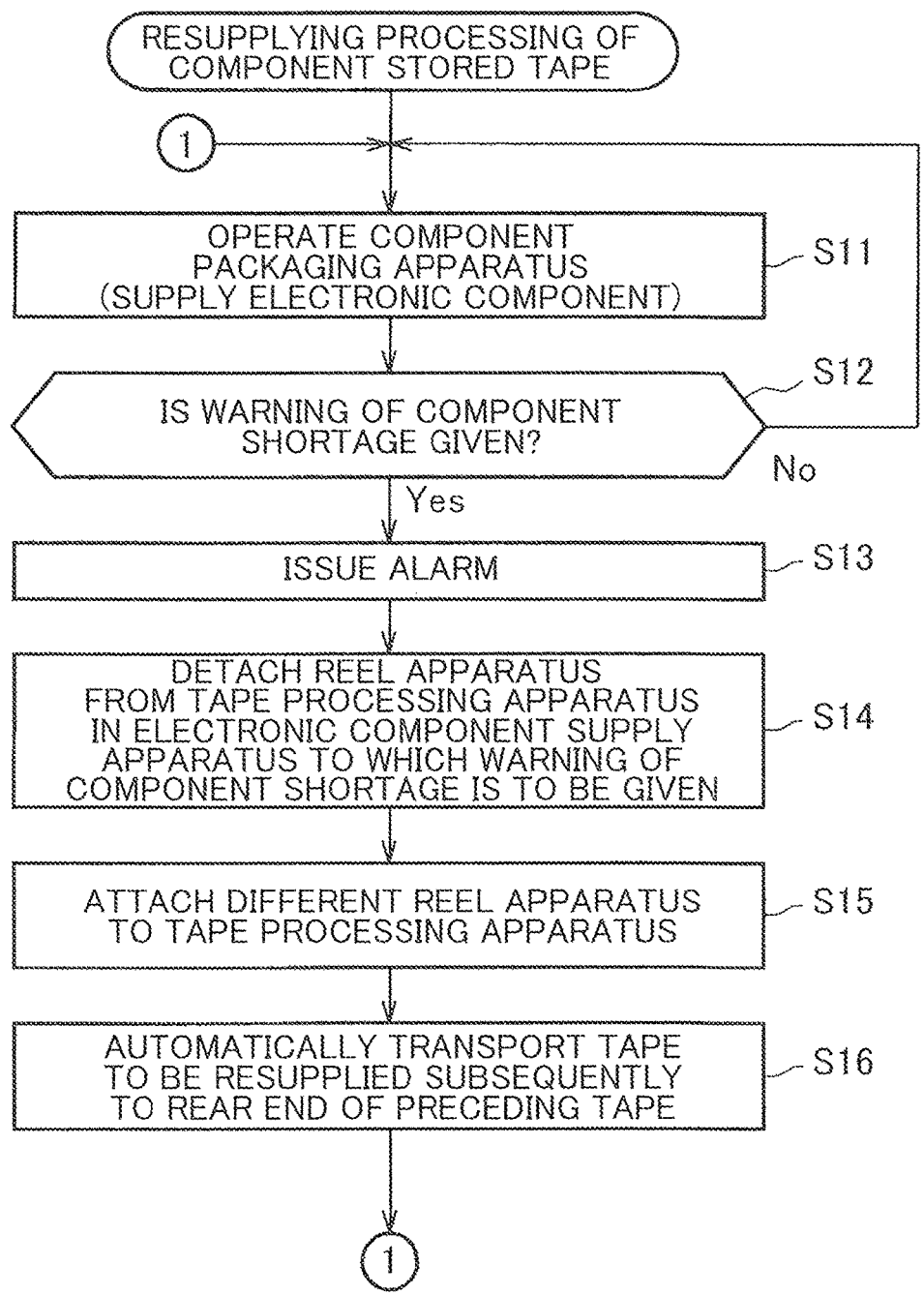
FIG. 19 is a flow chart showing a processing procedure of executing a method for resupplying the component stored tape.

Next, with reference to FIG. 18 and FIG. 19, resupplying processing of the component stored tape 100 will be described. FIG. 18 is a block diagram showing one example of a configuration of the control apparatus 90 attached to the component mounting apparatus 50. FIG. 19 is a flow chart showing a processing procedure of executing a method for resupplying the component stored tape 100.

As shown in FIG. 18, the control apparatus 90 has a data processing unit 91, a storage unit 92, a display unit 93, and an input apparatus 94. As the control apparatus 90, for example, a common PC (personal computer) can be used. The data processing unit 91 includes a CPU and executes control of each of the above-described units, various calculations, and the like according to a program.

The storage unit 92 has a ROM for storing various programs and data in advance, a RAM for temporarily storing a program and data as a working region, and a hard disk for storing various programs and data and is also used for storing a result or the like obtained by data processing. The display unit 93 is a display such as an LCD, and displays various kinds of information such as a calculation result obtained by the data processing unit 91. The input apparatus 94, which includes a keyboard, a mouse, an input interface with an external apparatus, and the like, is used for inputting various kinds of information.

As shown in FIG. 19, in Step S11, with the electronic component supply apparatus 1 including the reel apparatus 2 attached to the tape processing apparatus 3 disposed on the truck 40, the control apparatus 90 causes the component mounting apparatus 50 to operate. The component stored tape 100 is transported forward by operation of the upstream motor 5 and the downstream motor 4 of the electronic component supply apparatus 1, so that the electronic component 105 is supplied to the component mounting apparatus 50.

In Step S12, determination is made whether a warning of component shortage is given or not. Specifically, the control apparatus 90 determines whether there is little remaining component stored tape 100 in the electronic component supply apparatus 1 or not by a sensor (not shown) or the like for detecting the residual tape. Without a warning of component shortage in Step S12 (No in Step S12), the procedure returns to Step S11, so that the component mounting apparatus 50 continues operation.

On the other hand, with a warning of component shortage in Step S12 (Yes in Step S12), an alarm warning against component shortage is issued (Step S13). This alarm may be displayed on the display unit 93 included in the control apparatus 90 or may be issued by a sound of a buzzer or the like.

Subsequently, in Step S14, in the electronic component supply apparatus 1 to which a warning of component shortage is to be given, from the tape processing apparatus 3 having the reel apparatus 2 attached thereto, the reel apparatus 2 is detached. The work of detaching the reel apparatus 2 from the tape processing apparatus 3 is automatically conducted using the auto-moving truck 60 according to an instruction from the control apparatus 90. The work of detaching the reel apparatus 2, however, can be manually conducted.

Subsequently, in Step S15, a different reel apparatus 2 is attached to the tape processing apparatus 3 in a state of having the reel apparatus 2 detached in Step S14. Although the different reel apparatus 2 is ordinarily a reel apparatus of the same kind as that previously attached, a different kind of reel apparatus can be used. The work of attaching the different reel apparatus 2 to the tape processing apparatus 3 is automatically conducted using the auto-moving truck 60 according to an instruction from the control apparatus 90. The work of attaching the reel apparatus 2, however, can be manually conducted.

Then, in Step S16, subsequently to a rear end of the preceding component stored tape 100 remaining in the electronic component supply apparatus 1, the component stored tape 100 to be resupplied in the newly attached different reel apparatus 2 is automatically transported by operation of the upstream motor 5 and the downstream motor 4. Thereafter, the procedure returns to Step S11, so that the component mounting apparatus 50 is operated.

As described in the foregoing, in the present embodiment, the electronic component supply apparatus 1 includes the reel apparatus 2 having the tape reel 8 on which the component stored tape 100 is wound, and the tape processing apparatus 3 having the electronic component exposure unit 18 which causes the electronic component 105 stored in the component stored tape 100 to be exposed from the component stored tape 100 so as to be taken out. The reel apparatus 2 is detachable from the tape processing apparatus 3.

According to such a configuration, with the tape processing apparatus 3 being disposed and fixed at the component supply unit 53, replacing the reel apparatus 2 enables the electronic component supply apparatus 1 to be resupplied with a new component stored tape of the same kind or a component stored tape of a different kind. This eliminates the need of changing a disposition position of the electronic component exposure unit 18, i.e. a take-out position (component attracting position) of the electronic component 105. As a result, the configuration has an effect of reducing defective component take-out caused by deviation of the take-out position of the electronic component 105. A need of again instructing the component mounting apparatus 50 (system) about a take-out position of the electronic component 105 is also eliminated. In other words, the electronic component supply apparatus 1 can reliably take out and supply the electronic component 105 stored in the component stored tape 100.

In the present embodiment, the electronic component exposure unit 18 includes the edge 184 for cutting open the cover tape 104 of the component stored tape 100, so that the electronic component 105 is exposed by the cutting. In such a configuration, subsequently to a rear end of the preceding component stored tape 100, transporting the component stored tape 100 to be resupplied enables the electronic component 105 to be exposed without peeling the cover tape 104 from the carrier tape 101. Accordingly, it will be unnecessary to conduct "splicing", work requiring operator's mastery of skill and time, connecting a terminal end of a preceding component stored tape with a leading end of a subsequent component stored tape to be resupplied.

In the present embodiment, after the reel apparatus 2 is detached from the tape processing apparatus 3, the detached reel apparatus 2 is recovered into the reel apparatus holding stand 61 provided in the movable auto-moving truck 60. At the time of attaching a different reel apparatus 2 to the tape processing apparatus 3, the different reel apparatus 2 is supplied from the reel apparatus holding stand 61 of the auto-moving truck 60. Such a configuration enables resupplying work of the component stored tape 100 to be conducted efficiently and quickly. Designing the auto-moving truck 60 to be freely movable within a line of the component mounting apparatus 50 to automatically supply and recover the reel apparatus 2 enables a reduction in errors caused by an operator, thereby improving efficiency of the resupplying work of the component stored tape 100, as well as realizing labor saving.

In the present embodiment, a motor which supplies a driving force for feeding the component stored tape 100 is disposed in each of the reel apparatus 2 and the tape processing apparatus 3. Specifically, the upstream motor 5 (the first motor) is disposed in the reel apparatus 2, while the downstream motor 4 (the second motor) is disposed in the tape processing apparatus 3. With such a configuration, use of both the respective motors 4 and 5 of the tape processing apparatus 3 and the reel apparatus 2 enables high-speed transportation of the component stored tape 100 by a large driving force. The reel apparatus 2 can be operated singly by providing a power source, a control board for controlling the upstream motor 5, and a control apparatus (e.g. a computer). This enables an operation check to be conducted singly and an advance leading end search of the component stored tape 100.

Second Embodiment

Figure 20:
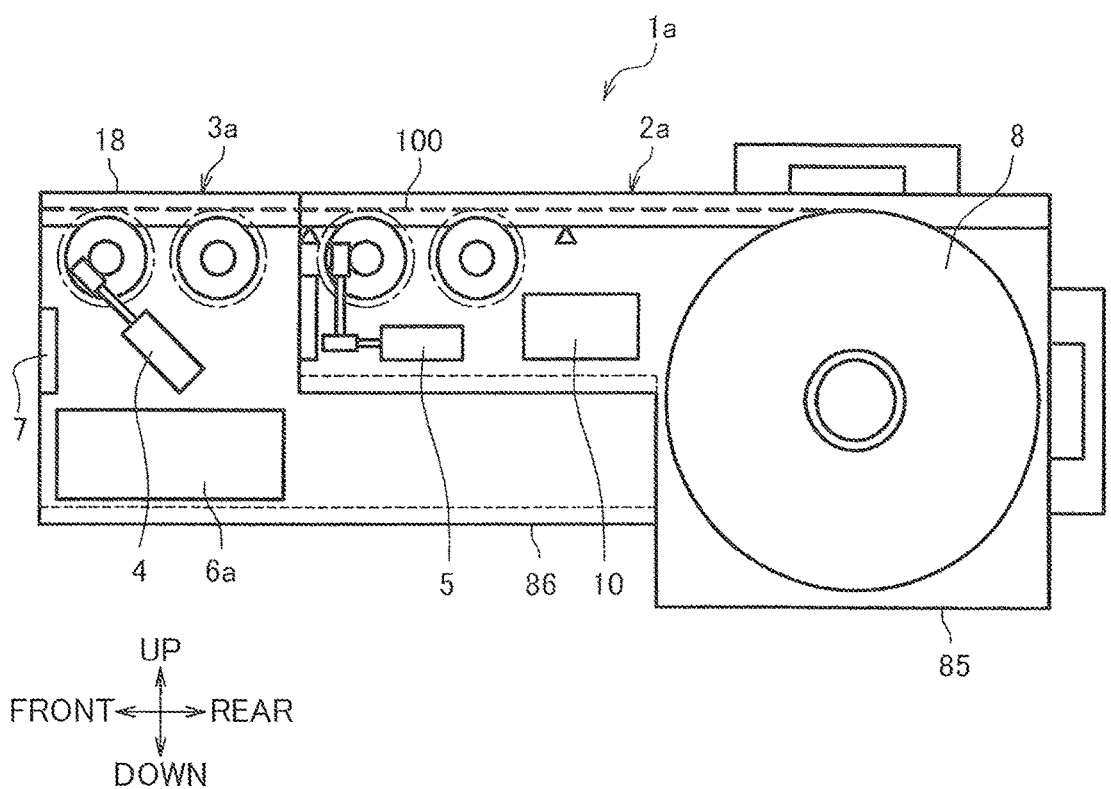
FIG. 20 is a drawing illustrating a configuration of an electronic component supply apparatus with a tape processing apparatus attached to a reel apparatus in a second embodiment of the present disclosure.
Figure 21:
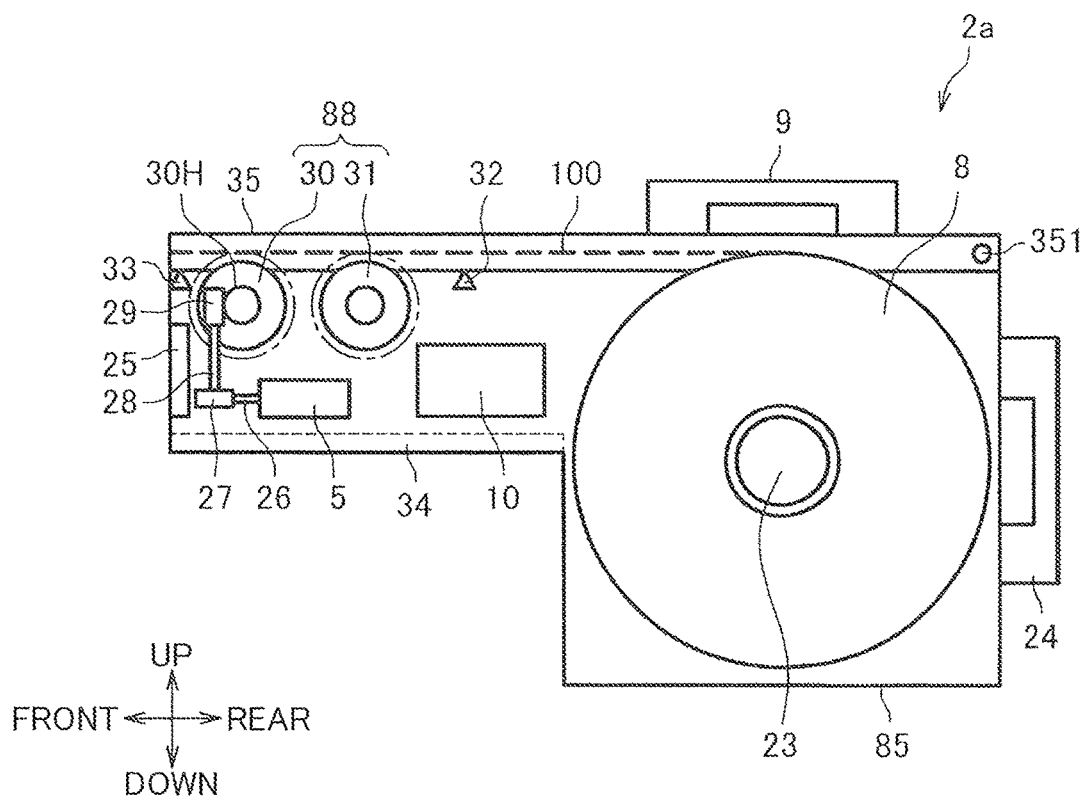
FIG. 21 is a drawing illustrating a configuration of the reel apparatus according to the second embodiment.

Next, with reference to FIG. 20 and FIG. 21, a second embodiment of the present disclosure will be described mainly with respect to points different from the above-described first embodiment, with description of common points omitted. FIG. 20 is a drawing illustrating a configuration of an electronic component supply apparatus 1a with a tape processing apparatus 3a attached to a reel apparatus 2a in the second embodiment of the present disclosure. FIG. 21 is a drawing illustrating a configuration of the reel apparatus 2a according to the second embodiment.

The second embodiment of the present disclosure differs from the first embodiment shown in FIG. 4 in that the tape processing apparatus 3a includes a first control board 6a for controlling a downstream motor 4 or the like, and the reel apparatus 2a includes a second control board 10 for controlling an upstream motor 5 or the like.

According to such second embodiment, providing the second control board 10 in the reel apparatus 2a allows the reel apparatus 2a to be operated singly by providing a power source and a control apparatus (e.g. a computer).

Third Embodiment

Figure 22:
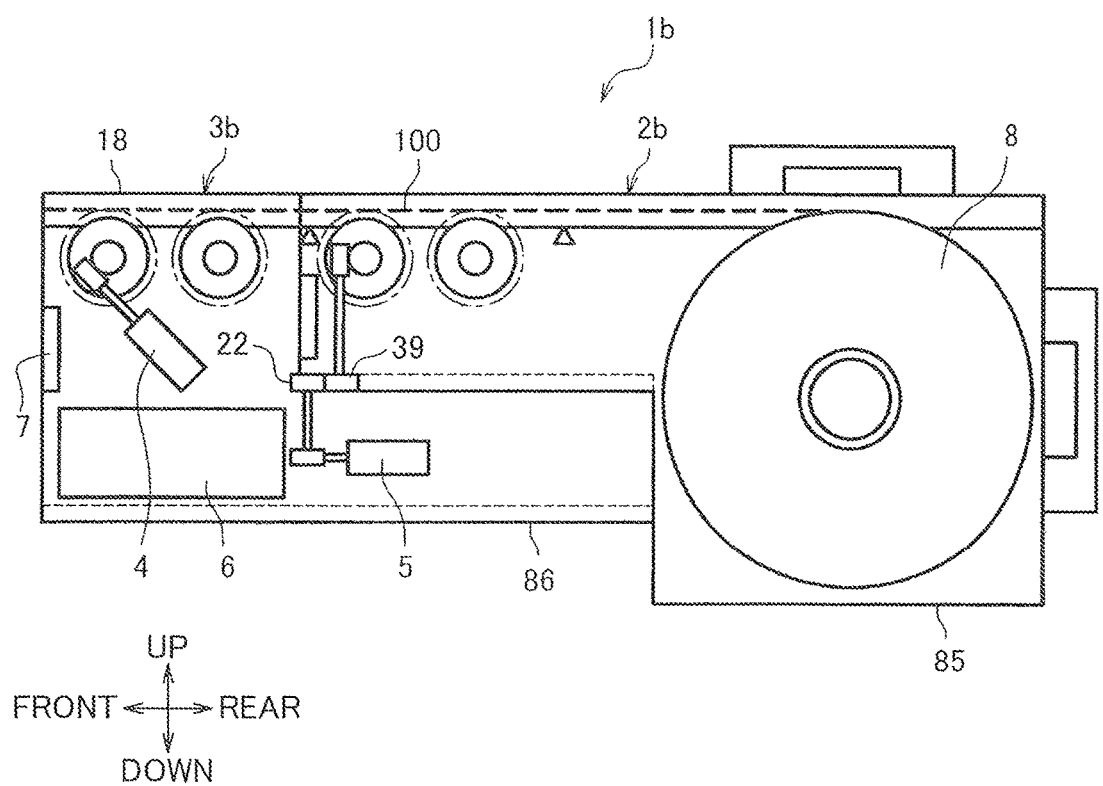
FIG. 22 is a drawing illustrating a configuration of an electronic component supply apparatus with a tape processing apparatus attached to a reel apparatus in a third embodiment of the present disclosure.
Figure 23:
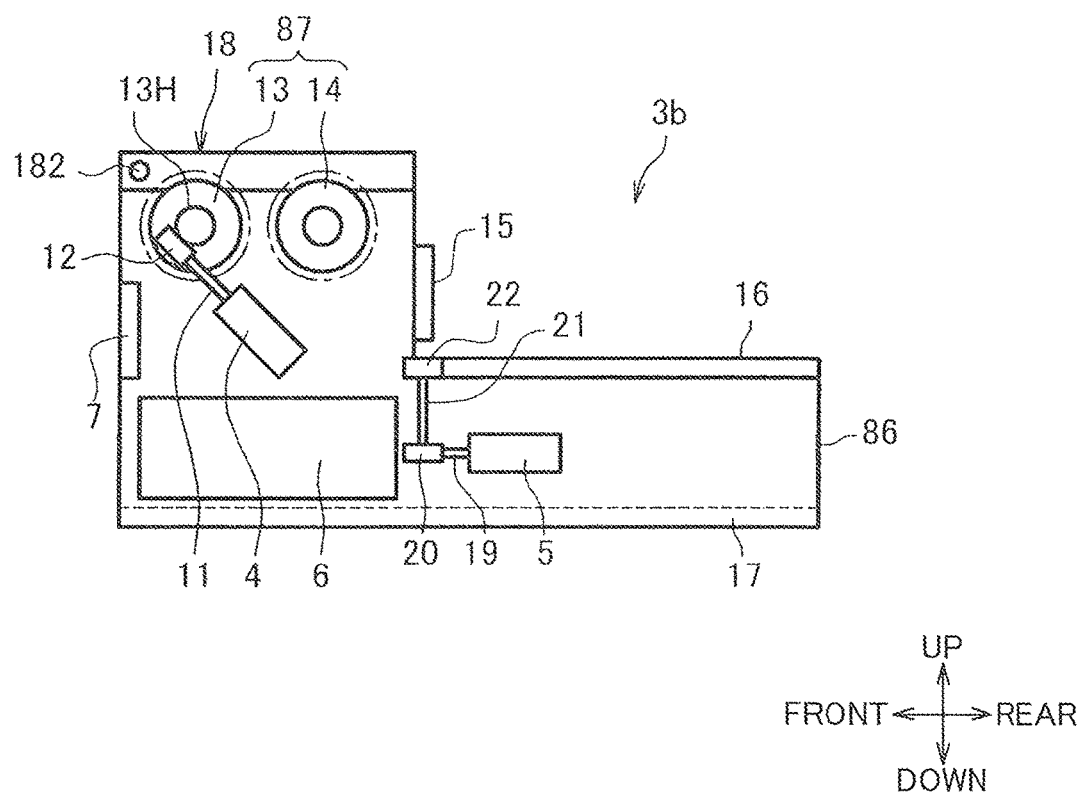
FIG. 23 is a drawing illustrating a configuration of the tape processing apparatus according to the third embodiment.
Figure 24:
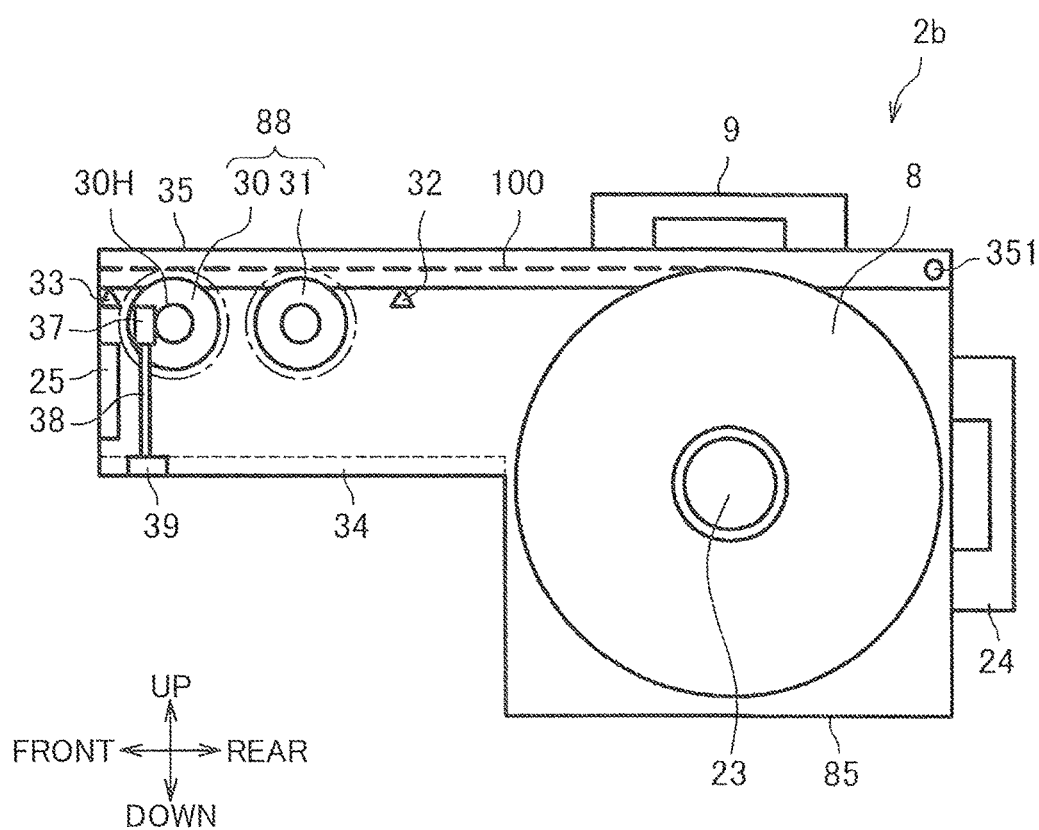
FIG. 24 is a drawing illustrating a configuration of the reel apparatus according to the third embodiment.

Next, with reference to FIG. 22 to FIG. 24, a third embodiment of the present disclosure will be described mainly with respect to points different from the above-described first embodiment, with description of common points omitted. FIG. 22 is a drawing illustrating a configuration of an electronic component supply apparatus 1b with a tape processing apparatus 3b attached to a reel apparatus 2b in the third embodiment of the present disclosure. FIG. 23 is a drawing illustrating a configuration of the tape processing apparatus 3b according to the third embodiment. FIG. 24 is a drawing illustrating a configuration of the reel apparatus 2b according to the third embodiment.

The third embodiment of the present disclosure differs from the first embodiment shown in FIG. 4 in that the tape processing apparatus 3b includes an upstream motor 5 and a downstream motor 4. Specifically, a motor which supplies a driving force for feeding a component stored tape 100 is disposed only in the tape processing apparatus 3b out of the reel apparatus 2b and the tape processing apparatus 3b. In other words, the tape processing apparatus 3b is mounted with not only the downstream motor 4 which drives sprockets 13 and 14 of the tape processing apparatus 3b but also with the upstream motor 5 which drives sprockets 30 and 31 of the reel apparatus 2b.

As shown in FIG. 24, a worm gear 37 meshed with a worm wheel gear 30H is coupled to a shaft 38, and the shaft 38 is coupled to a gear 39 (driving input unit). As shown in FIG. 22 and FIG. 23, the gear 39 is meshed with a gear 22. The gear 22 is coupled to a shaft 21, and the shaft 21 is connected to the upstream motor 5 via a gear mechanism 20 and a motor shaft 19. As the gear mechanism 20, for example, a pair of bevel gears meshing with each other can be used. The reel apparatus 2b has no driving source in itself, and the sprockets 30 and 31 are driven to rotate by a driving force of the upstream motor 5, which force is given to the gear 39.

According to such third embodiment, since the reel apparatus 2b is mounted with neither a motor nor a control board, no structural strength is required. Accordingly, a casing 85 of the reel apparatus 2b can be formed of integrally molded plastic, for example, which produces effects of weight saving and cost reduction.

A configuration in which a plurality of reel apparatuses 2b can be simultaneously attached to one tape processing apparatus 3b enables an increase in thickness in the horizontal direction of the tape processing apparatus 3b and an increase in size (diameter) of a motor to be commonly used, such as the upstream motor 5 and the downstream motor 4. This allows high-speed transportation of the component stored tape 100 by a large driving force. The tape processing apparatus 3b may be equipped with only one motor to have a driving force distributed by a gear mechanism as a driving force for its own sprockets 13 and 14 and a driving force for the sprockets 30 and 31 of the reel apparatus 2b.

Fourth Embodiment

Figure 25:
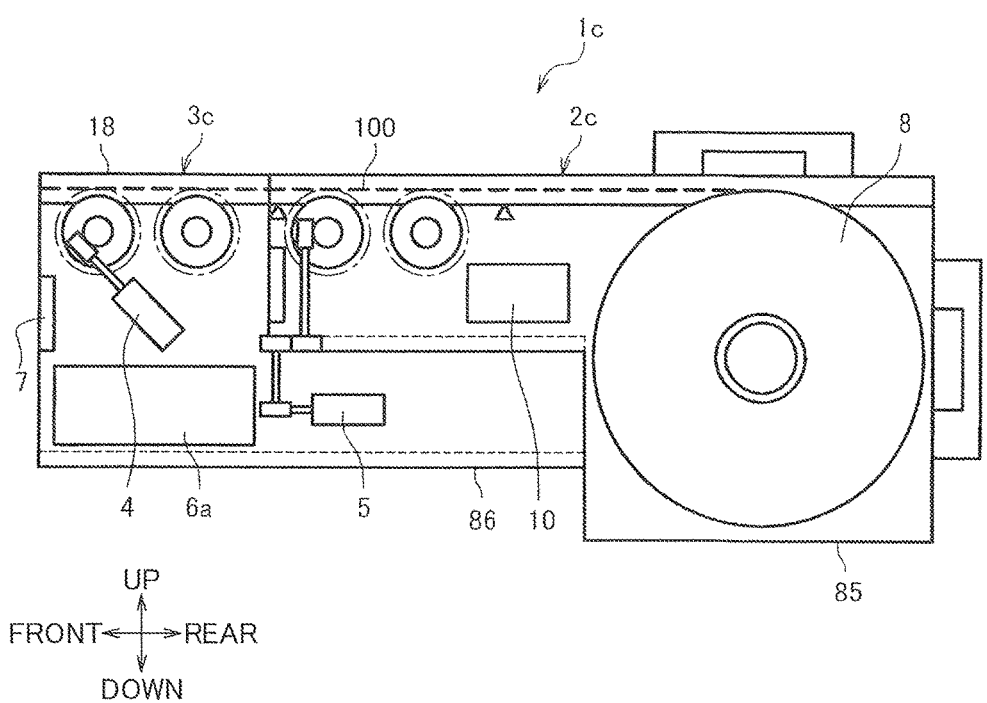
FIG. 25 is a drawing illustrating a configuration of an electronic component supply apparatus with a tape processing apparatus attached to a reel apparatus in a fourth embodiment of the present disclosure.
Figure 26:
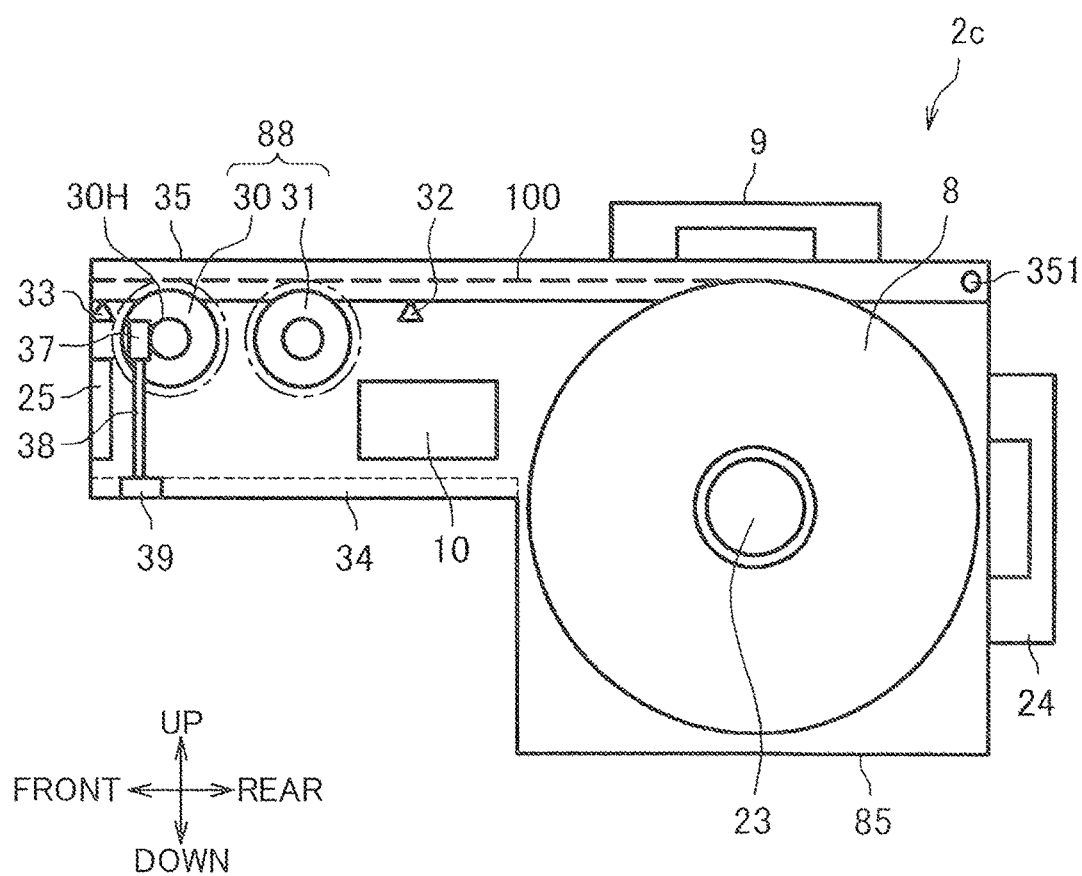
FIG. 26 is a drawing illustrating a configuration of the reel apparatus according to the fourth embodiment.

Next, with reference to FIG. 25 and FIG. 26, a fourth embodiment of the present disclosure will be described mainly with respect to points different from the above-described third embodiment, with description of common points omitted. FIG. 25 is a drawing illustrating a configuration of an electronic component supply apparatus 1c with a tape processing apparatus 3c attached to a reel apparatus 2c in the fourth embodiment of the present disclosure. FIG. 26 is a drawing illustrating a configuration of the reel apparatus 2c according to the fourth embodiment.

The fourth embodiment of the present disclosure differs from the third embodiment shown in FIG. 22 in that the tape processing apparatus 3c includes a first control board 6a for controlling a downstream motor 4 and the like, and that the reel apparatus 2c includes a second control board 10 for controlling an upstream motor 5 and the like.

According to such fourth embodiment, providing the second control board 10 in the reel apparatus 2c allows the reel apparatus 2c to be operated singly by providing a power source, a control apparatus (e.g. a computer), a motor, and the like.

Fifth Embodiment

Figure 27:
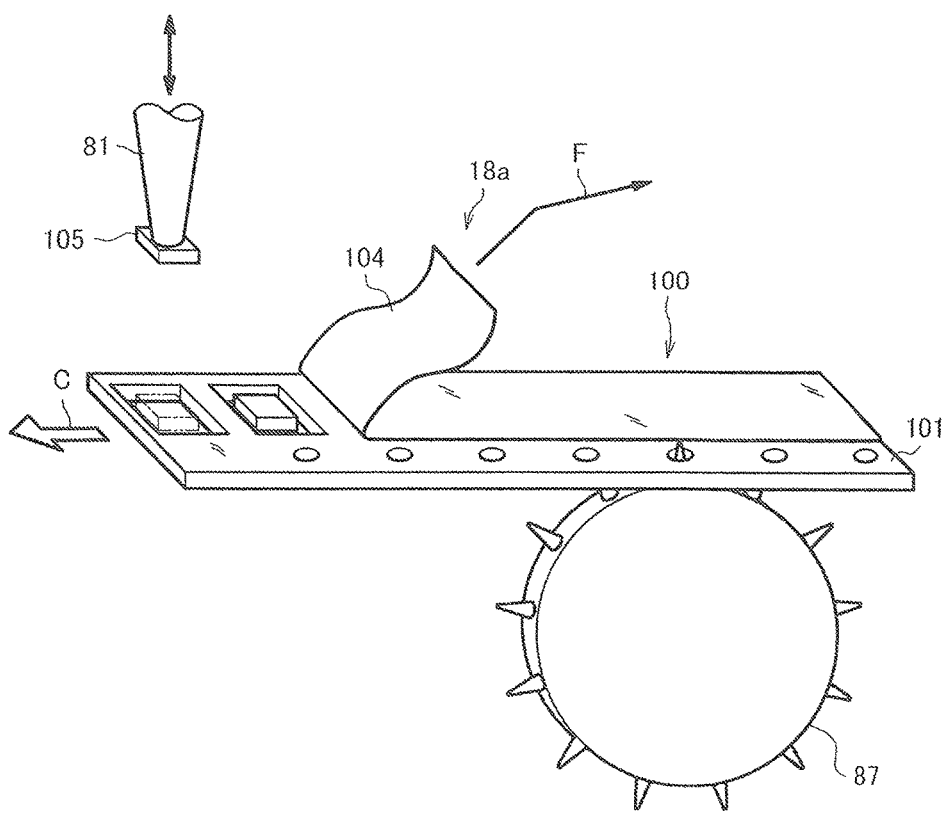
FIG. 27 is a drawing illustrating how an electronic component is exposed in a fifth embodiment of the present disclosure.
Figure 28:
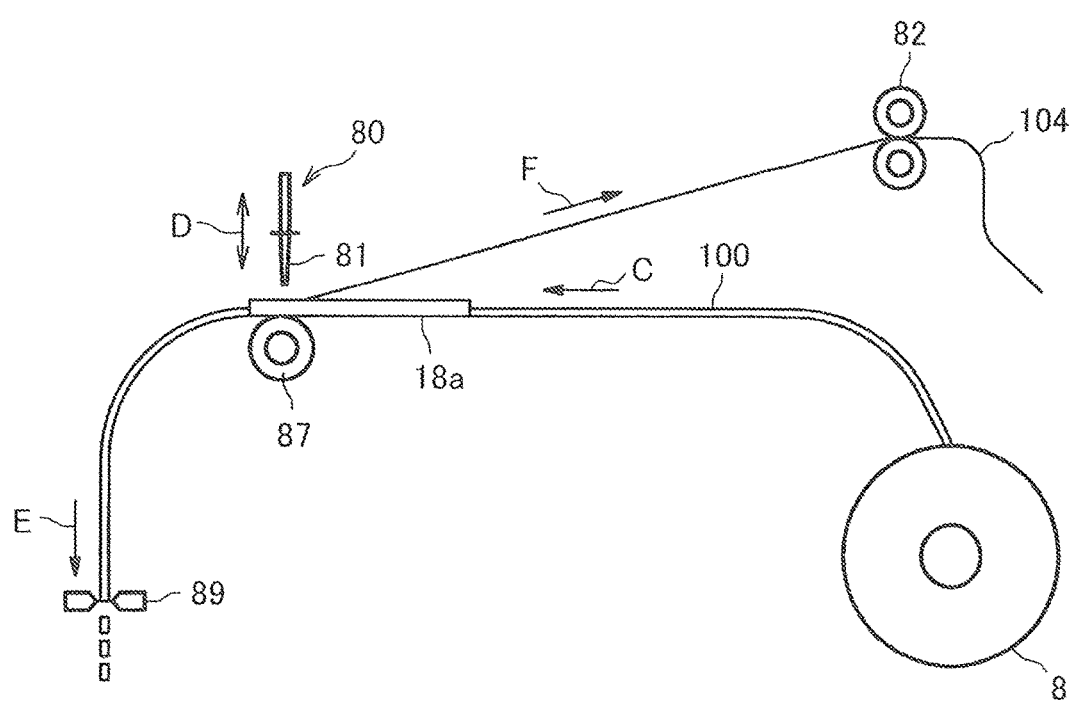
FIG. 28 is a drawing illustrating how a component stored tape is processed in the fifth embodiment of the present disclosure.

Next, with reference to FIG. 27 and FIG. 28, a fifth embodiment of the present disclosure will be described mainly with respect to points different from the above-described first embodiment, with description of common points omitted. FIG. 27 is a drawing illustrating how an electronic component 105 is exposed in the fifth embodiment of the present disclosure. FIG. 28 is a drawing illustrating how a component stored tape 100 is processed in the fifth embodiment of the present disclosure.

An electronic component exposure unit 18a exposes the electronic component 105 by peeling a cover tape 104 of the component stored tape 100. Herein, the component stored tape 100 is transported in a direction of an arrow C by rotation of a downstream sprocket 87.

The component stored tape 100 wound on a tape reel 8 is transported in the direction of the arrow C by the downstream sprocket 87. The electronic component exposure unit 18a exposes the electronic component 105 by peeling the cover tape 104 from a carrier tape 101. The exposed electronic component 105 is attracted to and held by a nozzle 81 as a result of up-down movement, in a direction of an arrow D, of a component attracting and attaching device 80 with the nozzle 81 attached to an end thereof. The peeled cover tape 104 is transported in a direction of an arrow F by a cover tape feeding apparatus 82 and stored in a storehouse (not shown) or the like. The carrier tape 101 from which the cover tape 104 has been peeled is transported in a direction of an arrow E and cut by a cutter unit 89.

Next, with reference to FIG. 29, resupply processing of the component stored tape 100 in the fifth embodiment of the present disclosure will be described. FIG. 29 is a flow chart showing a processing procedure of executing a method for resupplying the component stored tape 100 in the fifth embodiment of the present disclosure.

In the fifth embodiment, since processing in Steps S21 to S25 is the same as the processing in Steps S11 to S15 in FIG. 19, description thereof is omitted.

In Step S26, an operator conducts splicing by connecting a rear end obtained by cutting, with dedicated scissors, a rear end portion of a preceding component stored tape 100 in the electronic component supply apparatus with a leading end obtained by cutting, with dedicated scissors, a leading end portion of a component stored tape 100 to be resupplied in a newly attached different reel apparatus. Thereafter, the procedure returns to Step S21, so that the component mounting apparatus 50 is operated.

Thus, the present disclosure is also applicable to a case where the tape processing apparatus of the electronic component supply apparatus includes the electronic component exposure unit 18a which exposes the electronic component 105 by peeling the cover tape 104 from the component stored tape 100. Although the cover tape 104 is adhered to the carrier tape 101 at both sides of a component storing portion 103 which are orthogonal to a longitudinal direction of the carrier tape 101, the component storing portion 103 having the electronic component 105 stored therein, the present disclosure is applicable not only to a case where both of adhered parts on both sides are peeled to expose the electronic component 105, but also to a case where only an adhered part on one side is peeled to expose the electronic component 105. Specifically, the present disclosure is also applicable to a case where only an adhered part on one side of the cover tape 104 is peeled, and with an adhered part on the other side as a supporting point, the peeled cover tape 104 is bent in a direction orthogonal to the longitudinal direction of the carrier tape 101 to open an upper surface of the carrier tape 101, thereby exposing the electronic component 105.

Although the present disclosure has been described with respect to the embodiments in the foregoing, the present disclosure is not limited to the above-described embodiments and includes various modifications. For example, the above-described embodiments have been described in detail for describing the present disclosure in a manner easy to understand, and the present disclosure is not necessarily limited to those including all the configurations described. A part of a configuration of a certain embodiment can be replaced with a configuration of another embodiment, and a configuration of another embodiment can be added to a configuration of a certain embodiment. A part of a configuration of each embodiment allows for addition, deletion and replacement with other configurations.

For example, the structure of the component mounting apparatus 50 is not limited to the forms recited in the above-described embodiments but may have a different form.

The present disclosure provides an electronic component supply apparatus capable of reliably taking out and supplying an electronic component stored in a component stored tape, a reel apparatus, a tape processing apparatus, and a method for resupplying a component stored tape.

The invention claimed is:

1. An electronic component supply apparatus comprising:
a reel apparatus having a tape reel with a component stored tape wound thereon, the component stored tape storing electronic components;
a tape processing apparatus having an electronic component exposure unit which exposes the electronic components, that are stored in the component stored tape fed from the reel apparatus, so as to be taken out from the component stored tape; and
first and second motors disposed in the reel apparatus and the tape processing apparatus, respectively, to supply a driving force for feeding the component stored tape,
wherein the reel apparatus is detachable from the tape processing apparatus.

2. The electronic component supply apparatus according to claim 1, wherein
the component stored tape includes:
a carrier tape having a plurality of aligned component storing portions, each of the component storing portions storing one of the electronic components; and
a cover tape which covers the component storing portions storing the electronic components, and
the electronic component exposure unit includes an edge for cutting open the cover tape of the component stored tape to expose the electronic components by the cutting.

3. A method for resupplying a component stored tape, comprising:
providing a tape processing apparatus having an electronic component exposure unit which exposes electronic components, that are stored in the component stored tape that stores the electronic components, so as to be taken out from the component stored tape, a reel apparatus being attached to the tape processing apparatus, the reel apparatus having a tape reel with the component stored tape wound thereon, the component stored tape being fed toward the electronic component exposure unit;
supplying the electronic component;
detaching the reel apparatus from the tape processing apparatus having the reel apparatus attached thereto; and
attaching a different reel apparatus to the tape processing apparatus from which the reel apparatus is detached, wherein
a motor which supplies a driving force for feeding the component stored tape is disposed in each of the reel apparatus and the tape processing apparatus.

4. The method for resupplying a component stored tape according to claim 3, wherein
the component stored tape has a carrier tape having a plurality of aligned component storing portions, each of the component storing portions storing one of the electronic components; and a cover tape which covers the component storing portions storing the electronic components, and
the electronic component exposure unit cuts open the cover tape of the component stored tape by an edge to expose the electronic components.

5. The method for resupplying a component stored tape according to claim 3, wherein
in the detaching step, the detached reel apparatus is recovered into a reel apparatus holding unit provided in a movable truck, and
in the attaching step, the different reel apparatus is supplied from the reel apparatus holding unit in the movable truck.

* * * * *